US010700789B2

(12) United States Patent
Shiraishi et al.

(10) Patent No.: US 10,700,789 B2
(45) Date of Patent: Jun. 30, 2020

(54) OPTICAL RECEIVER

(71) Applicant: FUJITSU LIMITED, Kawasaki-shi, Kanagawa (JP)

(72) Inventors: Takashi Shiraishi, Atsugi (JP); Hideki Takauchi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/373,686

(22) Filed: Apr. 3, 2019

(65) Prior Publication Data

US 2019/0312652 A1 Oct. 10, 2019

(30) Foreign Application Priority Data

Apr. 9, 2018 (JP) .................................. 2018-074469

(51) Int. Cl.
| | |
|---|---|
| *H04B 10/69* | (2013.01) |
| *H04B 10/67* | (2013.01) |
| *H04B 10/40* | (2013.01) |
| *H05K 1/02* | (2006.01) |
| *G02B 6/42* | (2006.01) |
| *H03F 3/08* | (2006.01) |

(52) U.S. Cl.
CPC .......... *H04B 10/67* (2013.01); *G02B 6/4206* (2013.01); *G02B 6/4249* (2013.01); *H03F 3/08* (2013.01); *H04B 10/40* (2013.01); *H04B 10/69* (2013.01); *H04B 10/693* (2013.01); *H05K 1/0243* (2013.01)

(58) Field of Classification Search
CPC .............. H04B 10/693; H04B 10/6931; H04B 10/6933
See application file for complete search history.

(56) References Cited

U.S. PATENT DOCUMENTS

| | | | | |
|---|---|---|---|---|
| 5,311,353 | A * | 5/1994 | Crawford ................ | H03F 3/087 359/333 |
| 6,774,448 | B1 * | 8/2004 | Lindemann ......... | H01L 27/1463 257/438 |
| 2003/0081297 | A1 * | 5/2003 | Hasegawa ............ | G02B 6/4201 398/202 |
| 2005/0141169 | A1 * | 6/2005 | Yamasaki .............. | H05K 1/162 361/306.3 |

(Continued)

FOREIGN PATENT DOCUMENTS

| | | |
|---|---|---|
| JP | 2002-084235 | 3/2002 |
| JP | 2003-134051 | 5/2003 |

(Continued)

*Primary Examiner* — Nathan M Cors
(74) *Attorney, Agent, or Firm* — Fujitsu Patent Center

(57) ABSTRACT

An optical receiver includes a light receiving element array that includes a plurality of light receiving elements, a plurality of amplifiers that amplify respective currents obtained by the plurality of light receiving elements, a plurality of anode lines arranged in a region between the light receiving element array and the plurality of amplifiers, the plurality of anode lines coupling respective anodes of the plurality of light receiving elements to the plurality of amplifiers, respectively, and a cathode line disposed in a region different from the region between the light receiving element array and the plurality of amplifiers, the cathode line coupling respective cathodes of the plurality of light receiving elements to a bias power supply and a bypass capacitor.

10 Claims, 31 Drawing Sheets

(56) References Cited

U.S. PATENT DOCUMENTS

2014/0061441 A1   3/2014  Shiraishi et al.
2015/0069220 A1   3/2015  Yagisawa
2017/0084662 A1   3/2017  Daikuhara et al.

FOREIGN PATENT DOCUMENTS

| JP | 2014-049657 | 3/2014 |
| JP | 2015-056704 | 3/2015 |
| JP | 2016-018799 | 2/2016 |
| JP | 2016-058901 | 4/2016 |
| JP | 2017-059730 | 3/2017 |

* cited by examiner

OPTICAL RECEIVER

CROSS-REFERENCE TO RELATED APPLICATION

This application is based upon and claims the benefit of priority of the prior Japanese Patent Application No. 2018-74469, filed on Apr. 9, 2018, the entire contents of which are incorporated herein by reference.

FIELD

The embodiments discussed herein are related to an optical receiver that receives light.

BACKGROUND

There is a configuration in which a plurality of light receiving elements are each electrically coupled to a corresponding TIA by an anode wiring pattern and a cathode wiring pattern. TIA is an abbreviation of Transimpedance Amplifier. There is also an optical receiver which includes a chip capacitor constituting a bias separating circuit.

However, in a configuration in which cathode lines and anode lines of the light receiving elements are arranged in parallel with each other, for example, voltage variations in the cathode lines due to variation in a bias power supply occur also in the anode lines due to capacitive coupling. Therefore, input voltage of a TIA array varies, and crosstalk between channels occurs.

The followings are reference documents.
[Document 1] Japanese Laid-open Patent Publication No. 2015-056704 and
[Document 2] Japanese Laid-open Patent Publication No. 2016-18799

SUMMARY

According to an aspect of the embodiments, an optical receiver includes a light receiving element array that includes a plurality of light receiving elements, a plurality of amplifiers that amplify respective currents obtained by the plurality of light receiving elements, a plurality of anode lines arranged in a region between the light receiving element array and the plurality of amplifiers, the plurality of anode lines coupling respective anodes of the plurality of light receiving elements to the plurality of amplifiers, respectively, and a cathode line disposed in a region different from the region between the light receiving element array and the plurality of amplifiers, the cathode line coupling respective cathodes of the plurality of light receiving elements to a bias power supply and a bypass capacitor.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Embodiments of an optical receiver according to the present technology will hereinafter be described in detail with reference to the drawings.

First Embodiment (Optical Receiver According to First Embodiment)

Figure 1:
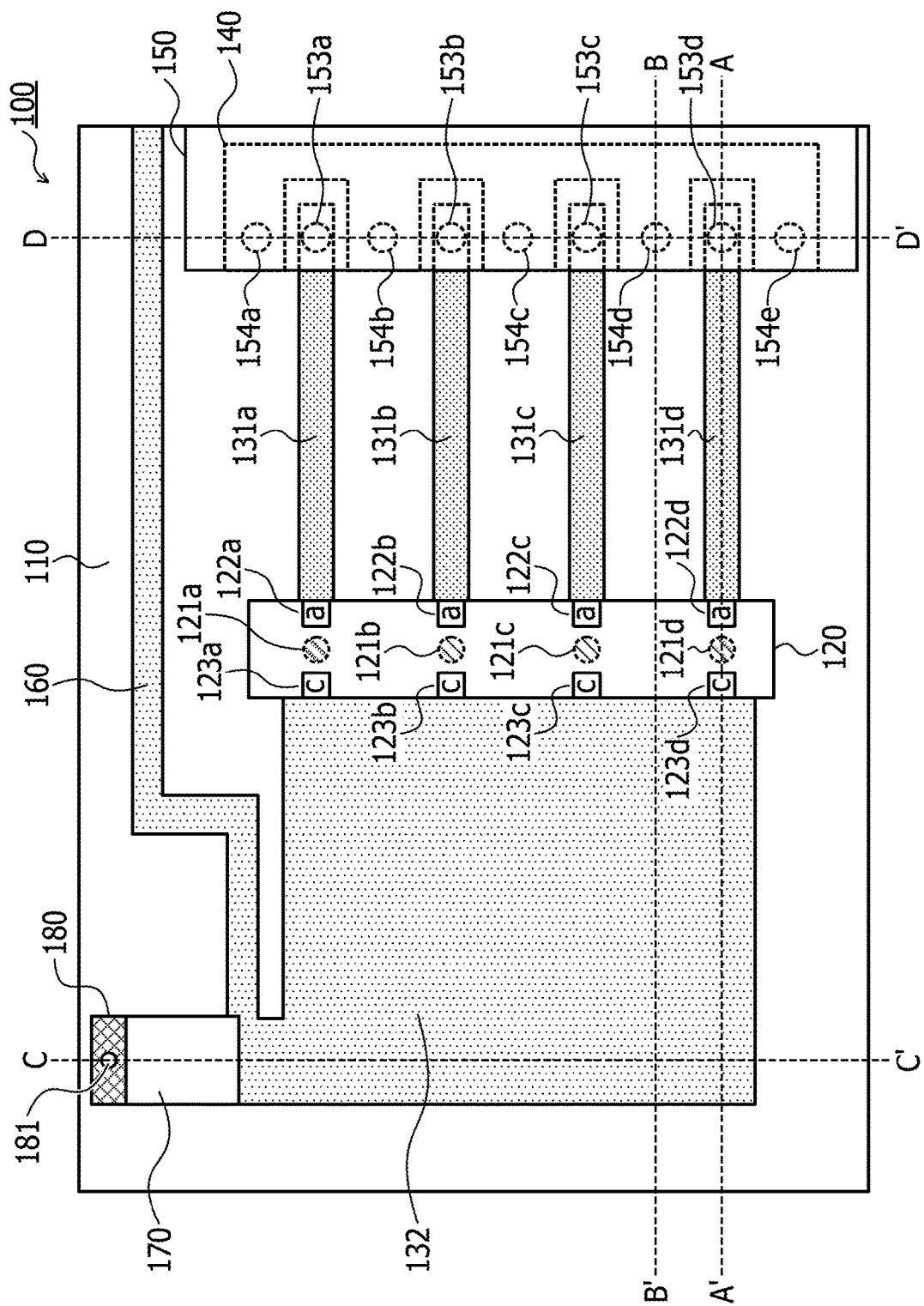
FIG. 1 is a top view illustrating one example of an optical receiver according to a first embodiment.
Figure 2:
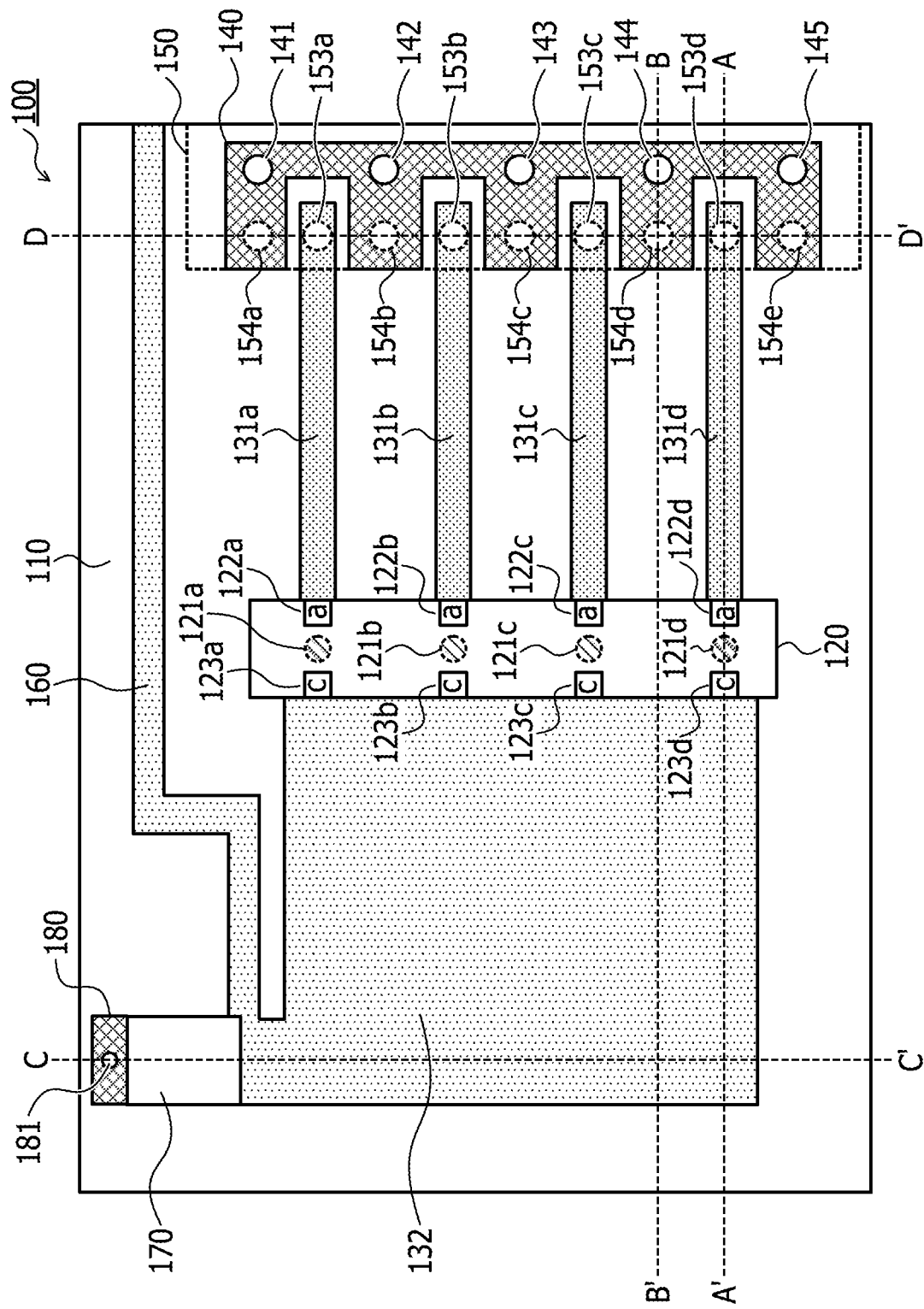
FIG. 2 is a partially transparent top view illustrating one example of an optical receiver according to the first embodiment.

FIG. 1 is a top view illustrating one example of an optical receiver according to a first embodiment. FIG. 2 is a partially transparent top view illustrating one example of an optical receiver according to the first embodiment. As illustrated in FIG. 1 and FIG. 2, an optical receiver 100 according to the first embodiment includes a printed board 110, a PD array 120, anode lines 131a to 131d, a cathode line 132, a ground electrode 140, and a TIA array 150. The optical receiver 100 also includes a bias line 160, a bypass capacitor 170, and a ground line 180. PD is an abbreviation of Photo Detector. FIG. 2 illustrates the TIA array 150 in a transparent state in the optical receiver 100 illustrated in FIG. 1.

The printed board 110 is a board on which electronic parts may be fixed and wired. The printed board 110 is formed by an insulator such as polyimide, polyester, or the like. As an example, the printed board 110 is an FPC (Flexible Printed Circuits: flexible printed board).

Figure 4:
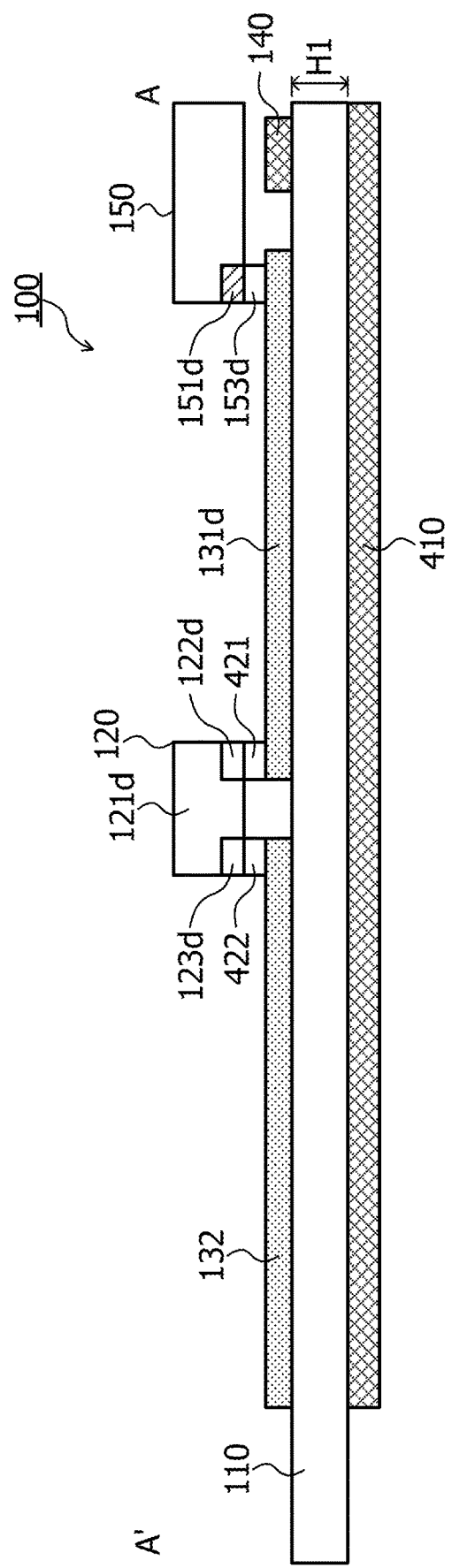
FIG. 4 is a sectional view taken along a line A-A', the sectional view illustrating one example of an optical receiver according to the first embodiment.

The PD array 120 is bump-coupled to a top surface of the printed board 110 (see FIG. 4, for example). The PD array 120 includes a plurality of PDs arranged in a one-dimensional manner. In the example illustrated in FIG. 1 and FIG. 2, the PD array 120 is a PD array corresponding to four channels, and includes PDs 121a to 121d. Each of the PDs 121a to 121d receives light emitted from an optical waveguide, and outputs a current signal obtained by receiving the light.

Anodes 122a to 122d (a) are anodes (positive electrodes) of the PDs 121a to 121d, respectively. Cathodes 123a to 123d (c) are cathodes (negative electrodes) of the PDs 121a to 121d, respectively. In addition, the cathodes 123a to 123d are arranged on an opposite side from the anodes 122a to 122d in the PD array 120. This facilitates disposing the cathode line 132 in a region different from a region between the PD array 120 and the TIA array 150, as will be described later.

The anode lines 131a to 131d are formed in the region between the PD array 120 and the TIA array 150 in the top surface of the printed board 110. For example, the anode line 131a is electric wiring that couples the anode 122a of the PD 121a to the TIA array 150. Similarly, the anode lines 131b to 131d are respectively electric wiring that couples the anodes 122b to 122d of the PDs 121b to 121d to the TIA array 150. Mutual intervals between the anode lines 131a to 131d may be set to be approximately 0.25 [mm], for example.

The cathode line 132 is formed in the region different from the region between the PD array 120 and the TIA array 150 in the top surface of the printed board 110. The cathode line 132 is electric wiring that couples the cathodes 123a to 123d of the PDs 121a to 121d to the bias line 160. For example, the cathode line 132 is disposed such that the cathode line 132 and the anode lines 131a to 131d sandwich the PD array 120. In the example illustrated in FIG. 1 and FIG. 2, the cathode line 132 is a solid electrode common to the cathodes 123a to 123d. The cathode line 132 may have a length of approximately 1 to 2 [mm], for example, in a current propagation direction (lateral direction in FIG. 1 and FIG. 2).

The ground electrode 140 is a ground electrode formed on the top surface of the printed board 110. In addition, the ground electrode 140 is formed so as to surround respective end portions of the anode lines 131a to 131d, the end portions being on an opposite side from the PD array 120. In addition, the ground electrode 140 is coupled to a ground line on an undersurface of the printed board 110 via vias 141 to 145 (see FIG. 2) (see FIG. 5, for example).

Figure 7:
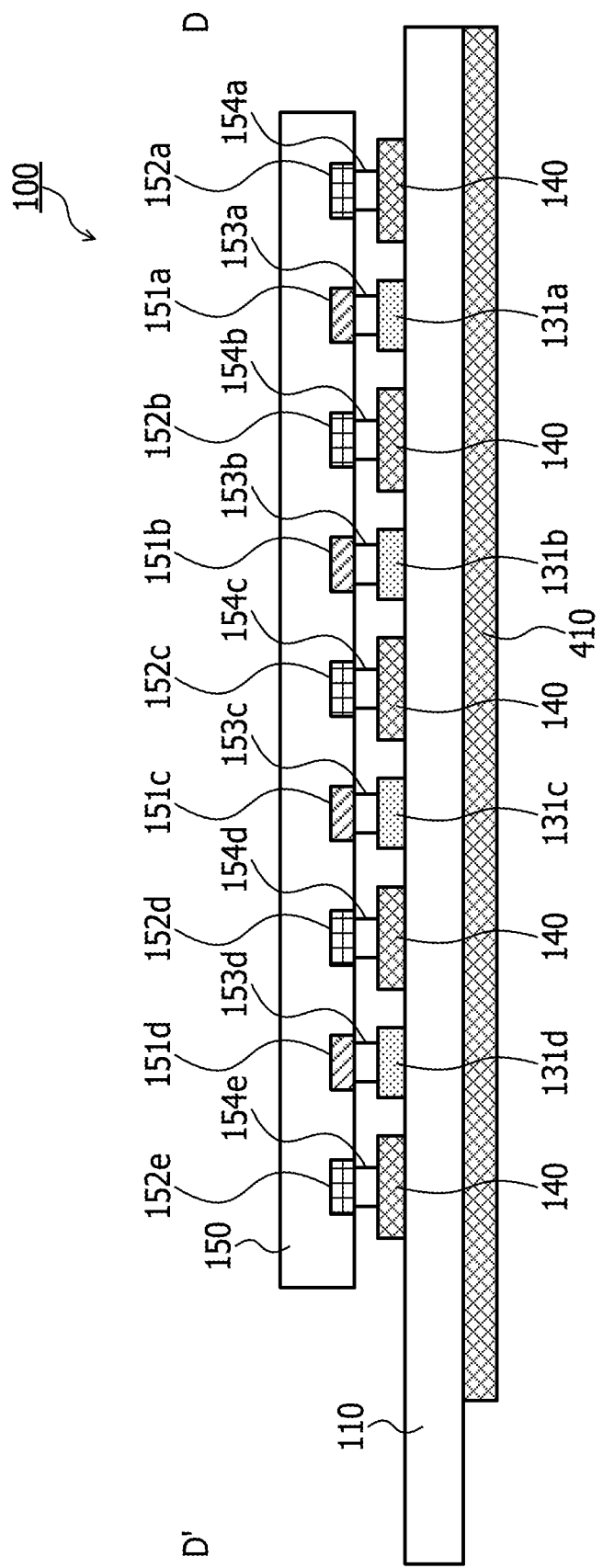
FIG. 7 is a sectional view taken along a line D-D', the sectional view illustrating one example of an optical receiver according to the first embodiment.

The TIA array 150 is bump-coupled to the top surface of the printed board 110 (see FIG. 7, for example). The TIA array 150 includes a plurality of TIAs (plurality of amplifiers) corresponding respectively to the PDs 121a to 121d and arranged in a one-dimensional manner. For example, the TIA array 150 is coupled to the anode line 131a via a bump 153a. Similarly, the TIA array 150 is coupled to the anode lines 131b to 131d via bumps 153b to 153d, respectively. In addition, the TIA array 150 is coupled to the ground electrode 140 via bumps 154a to 154e.

In addition, the TIA array 150 converts a current signal output from the PD 121a via the anode line 131a, for example, into a voltage signal, and outputs the converted voltage signal. Similarly, the TIA array 150 converts current signals respectively output from the PDs 121b to 121d via the anode lines 131b to 131d into voltage signals, and outputs the converted voltage signals.

The bias line 160 is formed on the top surface of the printed board 110. The bias line 160 is electric wiring that supplies a bias voltage from a bias power supply to the PDs 121a to 121d via the cathode line 132. In addition, the bias line 160 is electric wiring common to the PDs 121a to 121d (respective channels). It is thereby possible to uniformize a DC (Direct Current) bias to the PDs 121a to 121d (respective channels), and stabilize high-speed characteristics of the PDs 121a to 121d (respective channels).

The bypass capacitor 170 is formed on the top surface of the printed board 110. The bypass capacitor 170 is a capacitor having one terminal coupled to the cathode line 132 and the bias line 160, and having another end coupled to the ground line 180 (see FIG. 6, for example). During operation of the PDs 121a to 121d, the bypass capacitor 170 lets a noise component (high-frequency component) of the bias line 160 escape to the ground line 180, and thus suppresses variation of the direct current in the bias line 160. As an example, the bypass capacitor 170 may be a multilayer chip capacitor (for example, a ceramic capacitor) formed by stacking a large number of dielectrics such as titanium oxide, barium titanate, or the like and electrodes (see FIG. 8, for example).

The ground line 180 is formed on the top surface of the printed board 110. The ground line 180 is electric wiring coupled to the ground line on the undersurface of the printed board 110 via a via 181 (see FIG. 6, for example).

The optical receiver 100 is, as an example, an optical module compliant with a standard such as QSFP or the like. QSFP is an abbreviation of Quad Small Form-Factor Pluggable. However, the optical receiver 100 may applicable to QSFP, and besides, applicable to various kinds of optical modules.

Figure 3:
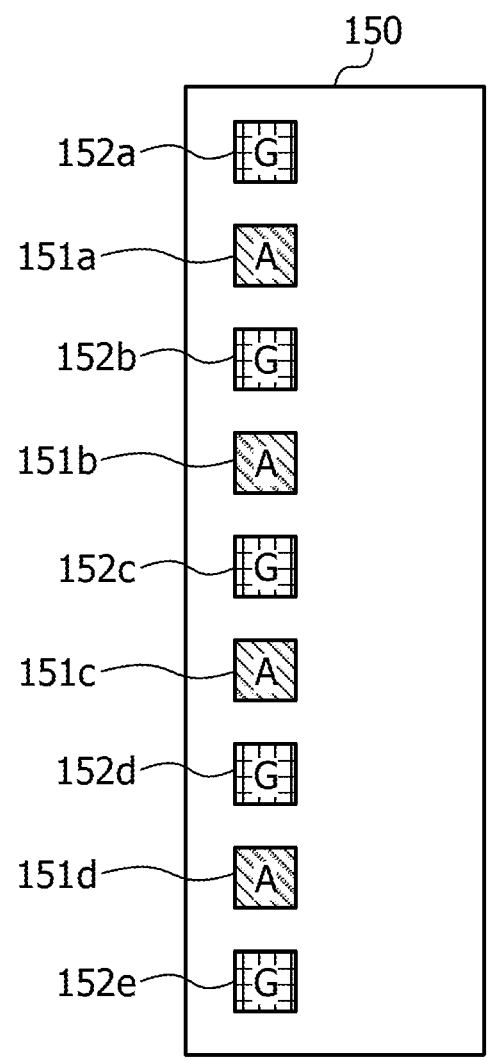
FIG. 3 is a transparent top view illustrating an example of electrode pad portions of a TIA array according to the first embodiment.

FIG. 3 is a transparent top view illustrating an example of electrode pad portions of a TIA array according to the first embodiment. In FIG. 3, parts similar to the parts illustrated in FIG. 1 and FIG. 2 are identified by the same reference numerals, and description thereof will be omitted. As illustrated in FIG. 3, anode pads 151a to 151d and ground pads 152a to 152e are disposed on the undersurface of the TIA array 150. The anode pads 151a to 151d and the ground pads 152a to 152e are arranged alternately with each other to improve characteristics of return current.

The anode pad 151a, for example, is the anode of the TIA corresponding to the PD 121a in the TIA array 150. Similarly, the anode pads 151b to 151d are respectively the anodes of the TIAs corresponding to the PDs 121b to 121d in the TIA array 150. In addition, the anode pad 151a, for example, is coupled to the anode line 131a via the bump 153a illustrated in FIG. 1 and FIG. 2. Similarly, the anode pads 151b to 151d are respectively coupled to the respective anode lines 131b to 131d via the bumps 153b to 153d illustrated in FIG. 1 and FIG. 2.

The ground pad 152a, for example, is an electrode coupled to the ground electrode 140 via the bump 154a illustrated in FIG. 1 and FIG. 2. Similarly, the ground pads 152b to 152e are respectively electrodes coupled to the ground electrode 140 via the bumps 154b to 154e illustrated in FIG. 1 and FIG. 2 (see FIG. 4, for example).

FIG. 4 is a sectional view taken along a line A-A', the sectional view illustrating one example of an optical receiver according to the first embodiment. In FIG. 4, parts similar to the parts illustrated in FIGS. 1 to 3 are identified by the same reference numerals, and description thereof will be omitted. A thickness H1 of the printed board 110 may be set to be approximately 12.5 to 25 [μm] as an example. In addition, the anode pad 151d among the anode pads 151a to 151d illustrated in FIG. 3 is coupled to the anode line 131d via the bump 153d, as illustrated in FIG. 4.

In addition, as described above, the PD array 120 is bump-coupled to the printed board 110. As illustrated in FIG. 4, as for the PD 121d, for example, the anode 122d of the PD 121d is coupled to the anode line 131d via a bump 421. In addition, the cathode 123d of the PD 121d is coupled to the cathode line 132 via a bump 422.

In addition, as illustrated in FIG. 4, the ground line 410 (ground plane) is formed on the undersurface of the printed board 110. The ground line 410 is formed on the undersurface of a region in which the PD array 120, the anode lines 131a to 131d, the cathode line 132, and the ground electrode 140 are formed in the printed board 110.

Figure 5:
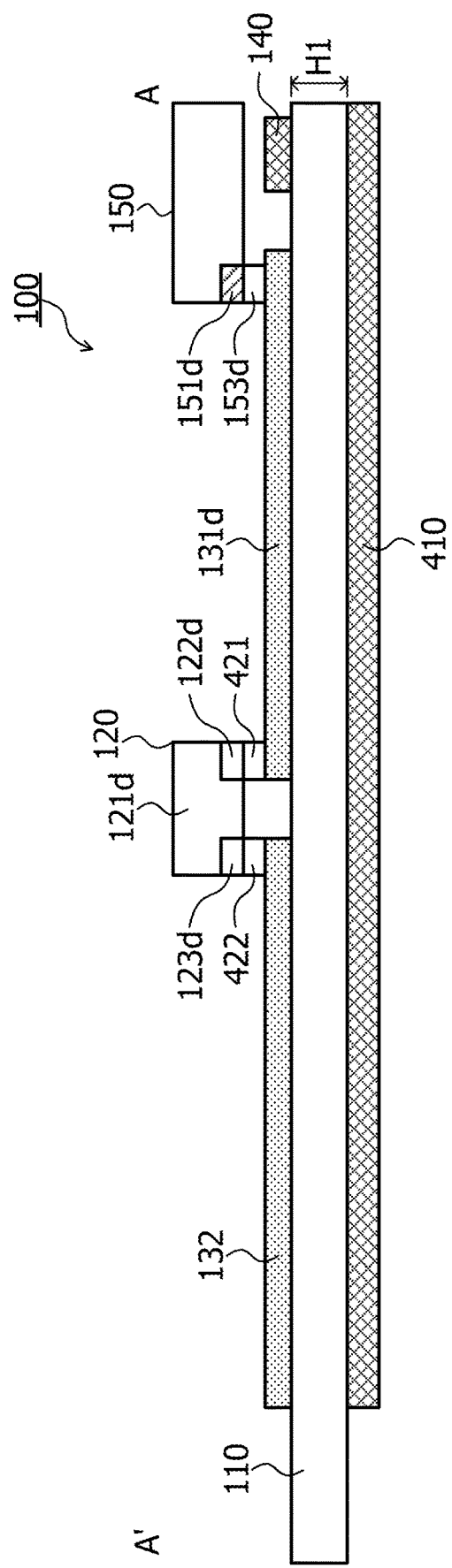
FIG. 5 is a sectional view taken along a line B-B', the sectional view illustrating one example of an optical receiver according to the first embodiment.

FIG. 5 is a sectional view taken along a line B-B', the sectional view illustrating one example of an optical receiver according to the first embodiment. In FIG. 5, parts similar to the parts illustrated in FIGS. 1 to 4 are identified by the same reference numerals, and description thereof will be omitted. As described above, the TIA array 150 is coupled to the ground electrode 140 via the bumps 154a to 154e. For example, as illustrated in FIG. 5, the TIA array 150 is coupled to the ground electrode 140 via the bump 154d.

In addition, as described above, the ground electrode 140 is coupled to the ground line on the undersurface of the printed board 110 via the vias 141 to 145. For example, as illustrated in FIG. 5, the ground electrode 140 is coupled to the ground line 410 via the via 144.

Figure 6:
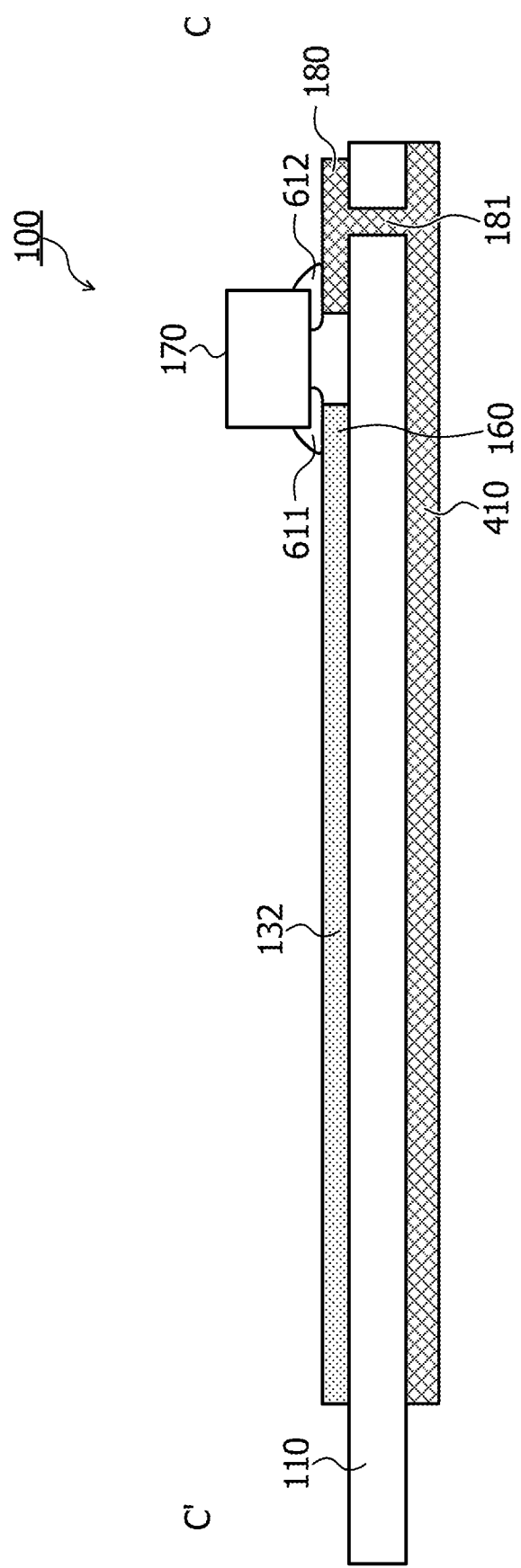
FIG. 6 is a sectional view taken along a line C-C', the sectional view illustrating one example of an optical receiver according to the first embodiment.

FIG. 6 is a sectional view taken along a line C-C', the sectional view illustrating one example of an optical receiver according to the first embodiment. In FIG. 6, parts similar to the parts illustrated in FIGS. 1 to 5 are identified by the same reference numerals, and description thereof will be omitted. As illustrated in FIG. 6, the bypass capacitor 170 has one terminal coupled to the cathode line 132 and the bias line 160 via a solder 611, and has another terminal coupled to the ground line 180 via a solder 612. In addition, as illustrated in FIG. 6, the ground line 180 is coupled to the ground line 410 via the via 181.

FIG. 7 is a sectional view taken along a line D-D', the sectional view illustrating one example of an optical receiver according to the first embodiment. In FIG. 7, parts similar to the parts illustrated in FIGS. 1 to 6 are identified by the same reference numerals, and description thereof will be omitted. As illustrated in FIG. 7, the anode pads 151a to 151d are respectively coupled to the respective anode lines 131a to 131d via bumps 153a to 153d. In addition, the ground pads 152a to 152e are respectively coupled to the ground electrode 140 via the bumps 154a to 154e.

As illustrated in FIGS. 1 to 7, the optical receiver 100 according to the first embodiment includes the cathode line 132 in the region different from the region between the PD array 120 and the TIA array 150. It is thereby possible to suppress voltage variation in the input of the TIA array 150, and suppress crosstalk between the channels in the TIA array 150.

For example, in the cathode line 132 of the PDs 121a to 121d, the cathode line 132 being coupled to the bias power supply, voltage variation due to variation of the bias power supply may occur. Therefore, if a configuration is adopted in which the cathode line 132 of the PDs 121a to 121d is disposed in parallel with the anode lines 131a to 131d, the voltage variation occurring in the cathode line 132 also occurs in the anode lines 131a to 131d due to capacitive coupling. In addition, because the input of the TIA array 150 is susceptible to voltage variation, when voltage variation occurs in the anode lines 131a to 131d, crosstalk between the channels occurs in the TIA array 150.

On the other hand, in the optical receiver 100, the capacitance of the PD array 120 is small, for example, approximately 100 [fF], and functions as a high-pass filter for the voltage variation in the cathode line 132. The voltage variation may therefore be cut off. Thus, the voltage variation occurring in the cathode line 132 may be suppressed from occurring also in the anode lines 131a to 131d. It is thereby possible to suppress voltage variation in the input of the TIA array 150, and suppress crosstalk between the channels in the TIA array 150.

In addition, in the optical receiver 100, the ground line 410 coupled to the TIA array 150 is formed also on the undersurface of a region in which the cathode line 132 is formed in the printed board 110. In addition, as described above, the thickness of the printed board 110 may be reduced (to approximately 12.5 to 25 [μm], for example) by using an FPC as the printed board 110, for example. Thus, a capacitance is formed by the cathode line 132 and the ground line 410. High-frequency components of return currents output from the cathodes 123a to 123d may be bypassed by this capacitance.

For example, the cathodes 123a to 123d respectively output, to the cathode line 132, return currents corresponding to the current signals output from the anodes 122a to 122d to the TIA array 150. The return currents are input to the ground pads 152a to 152e of the TIA array 150 via the cathode line 132, the bypass capacitor 170, the ground line 180, the via 181, and the ground line 410. In addition, as described above, in the optical receiver 100, a capacitor having an inferior high-frequency characteristic, such as a multilayer chip capacitor or the like, is used as the bypass capacitor 170. Therefore, if the ground line 410 is not formed also on the undersurface of the region in which the cathode line 132 is formed in the printed board 110, the return currents pass through the bypass capacitor 170, and thereby a high-frequency characteristic is degraded.

On the other hand, in the optical receiver 100, high-frequency components of the return currents output from the cathodes 123a to 123d may be bypassed to the ground line 410 by the capacitance formed by the cathode line 132 and the ground line 410. Thus, the high-frequency components of the return currents may be input to the ground pads 152a to 152e of the TIA array 150 without the intervention of the bypass capacitor 170. Therefore, even in the configuration using a capacitor having an inferior high-frequency characteristic as the bypass capacitor 170, a degradation in the high-frequency characteristics of the return currents may be suppressed.

(Characteristic of Multilayer Chip Capacitor Used as Bypass Capacitor According to First Embodiment)

Figure 8:
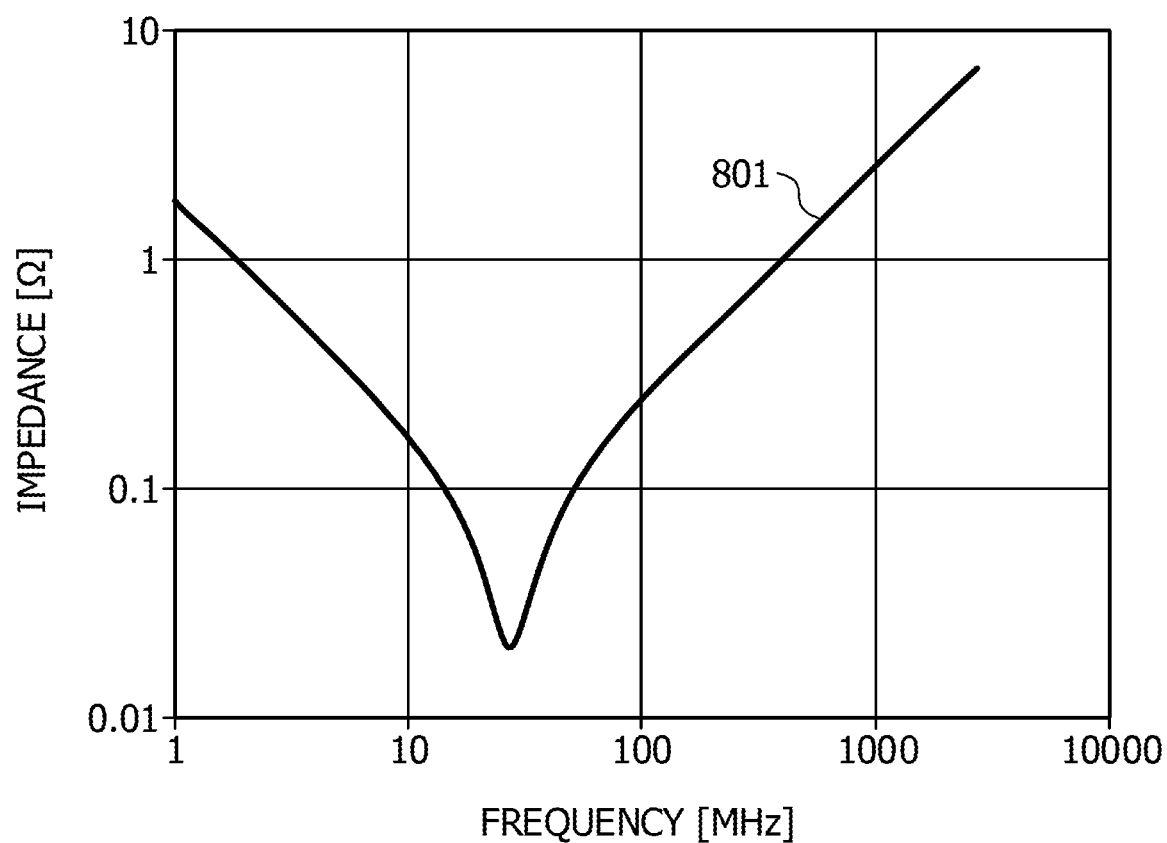
FIG. 8 is a graph illustrating an example of a characteristic of a multilayer chip capacitor used as a bypass capacitor according to the first embodiment.

FIG. 8 is a graph illustrating an example of a characteristic of a multilayer chip capacitor used as a bypass capacitor according to the first embodiment. In FIG. 8, an axis of abscissas logarithmically indicates frequency [MHz], and an axis of ordinates indicates impedance [Ω]. A frequency characteristic 801 represents a characteristic of impedance with respect to frequency in the multilayer chip capacitor used as the bypass capacitor 170. As an example, the frequency characteristic 801 represents a frequency characteristic of a multilayer chip capacitor of 0.1 [μF] in a 1005 size (1.0 [mm]×0.5 [mm]).

As indicated by the frequency characteristic 801, the multilayer chip capacitor has an inferior high-frequency characteristic (high impedance at high frequencies) as compared with an expensive microchip capacitor, for example. On the other hand, the above-described optical receiver 100 may suppress a degradation in the high-frequency characteristics of the return currents even in the configuration in which the multilayer chip capacitor having an inferior high-frequency characteristic is used as the bypass capacitor 170.

(Frequency Characteristics in Optical Receiver According to First Embodiment)

Figure 9:
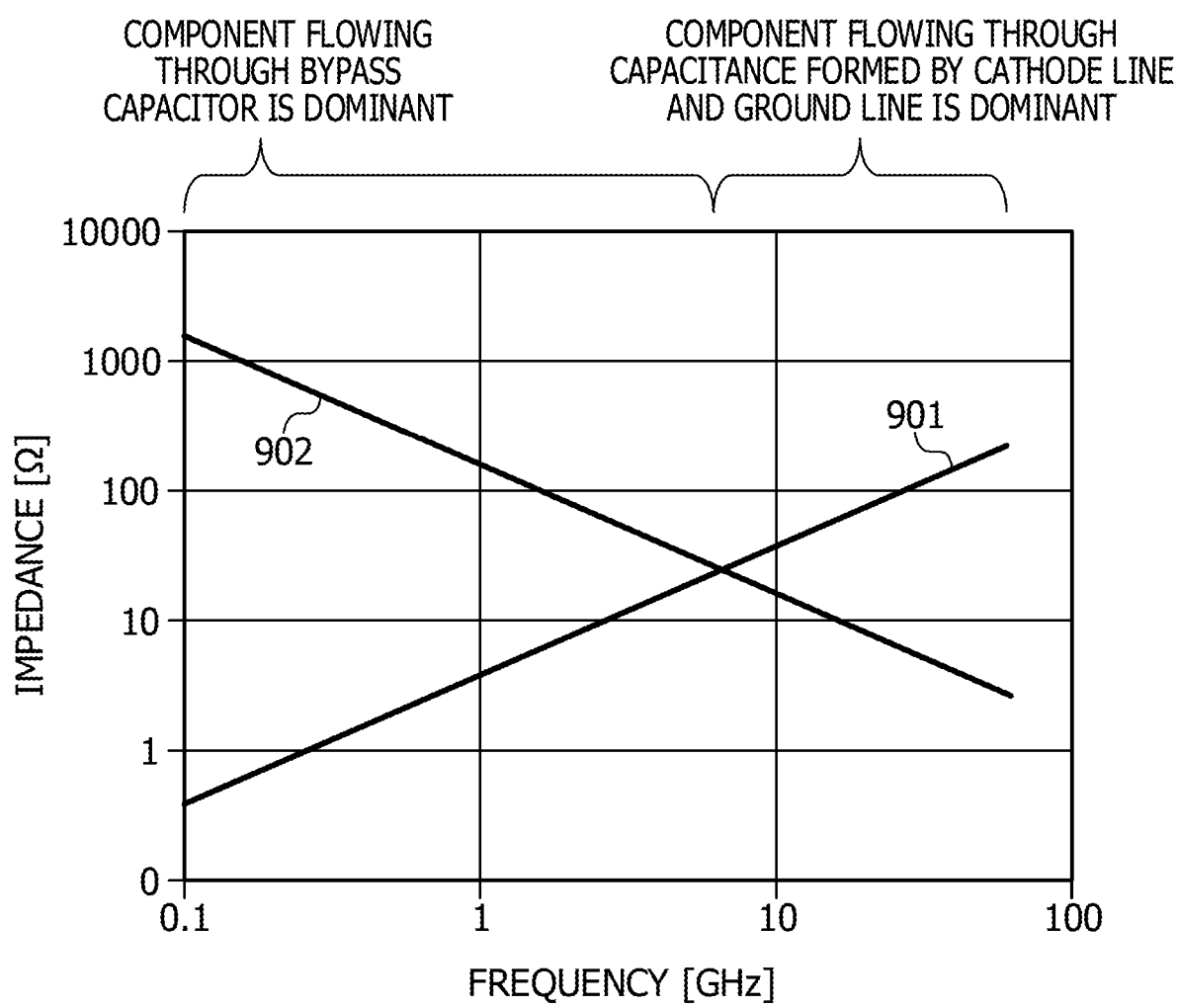
FIG. 9 is a graph illustrating an example of frequency characteristics in an optical receiver according to the first embodiment.

FIG. 9 is a graph illustrating an example of frequency characteristics in an optical receiver according to the first embodiment. In FIG. 9, an axis of abscissas logarithmically indicates frequency [GHz], and an axis of ordinates indicates impedance [Ω]. A frequency characteristic 901 represents a characteristic of impedance with respect to frequency in the bypass capacitor 170 for which a multilayer chip capacitor is used and inductance of wiring thereof. As indicated by the frequency characteristic 901, the bypass capacitor 170 and the inductance of the wiring have a high impedance at high frequencies (for example, 7 [GHz] or higher).

A frequency characteristic 902 represents a characteristic of impedance with respect to frequency in the capacitance (for example, 1 [pF]) formed by the cathode line 132 and the ground line 410. As indicated by the frequency characteristic 902, the capacitance formed by the cathode line 132 and the ground line 410 has a low impedance at high frequencies (for example, 7 [GHz] or higher).

Thus, a component flowing through the bypass capacitor 170 is dominant at low frequencies (for example, 7 [GHz] or lower), and a component flowing through the capacitance formed by the cathode line 132 and the ground line 410 is dominant at high frequencies (for example, 7 [GHz] or higher). Therefore, as described above, high-frequency components of the return currents output from the cathodes 123a to 123d may be bypassed to the ground line 410 by the capacitance formed by the cathode line 132 and the ground line 410.

(Configuration Including Power Supply Unit of Optical Receiver According to First Embodiment)

Figure 10:
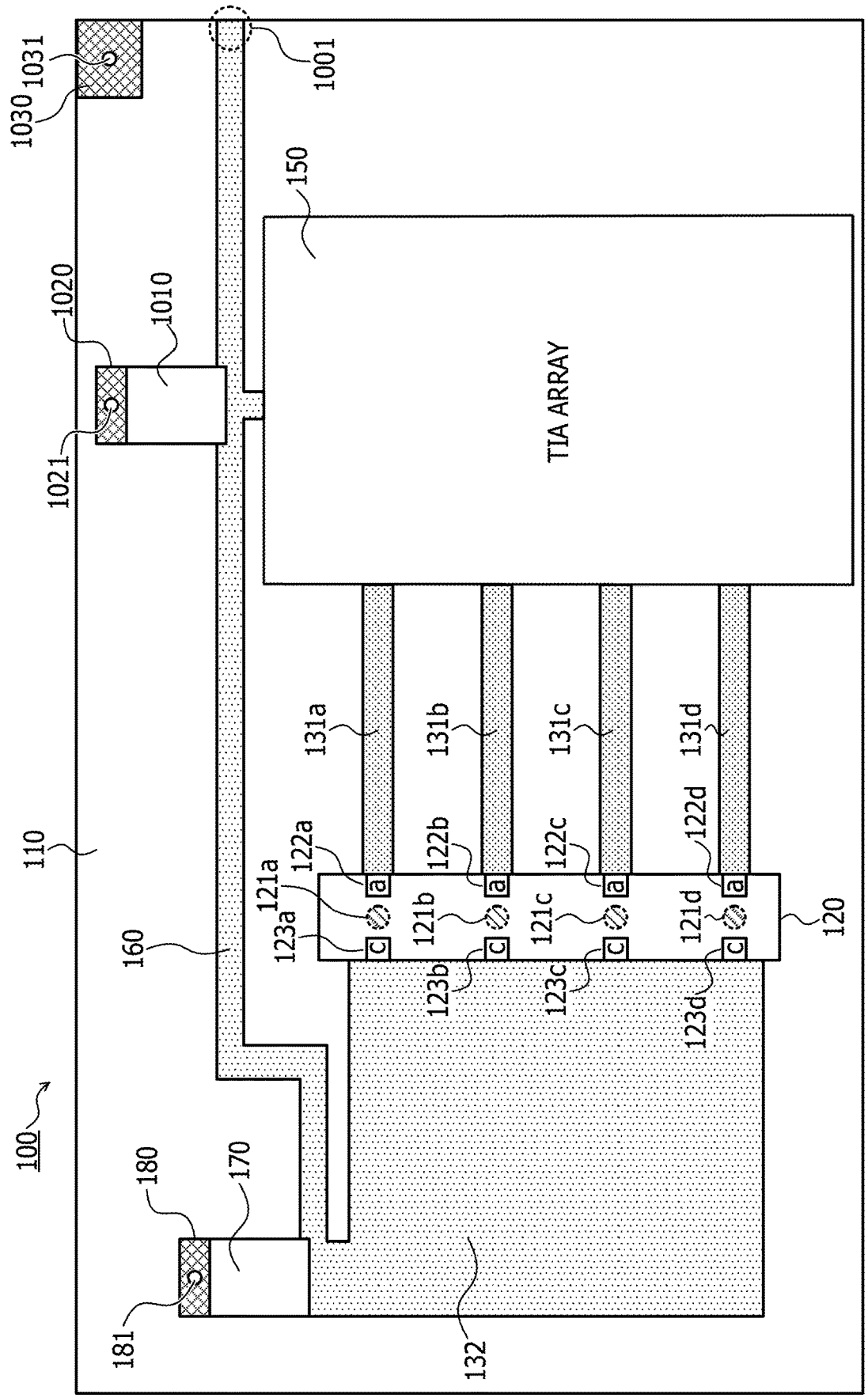
FIG. 10 is a top view illustrating an example of a configuration including a power supply unit of an optical receiver according to the first embodiment.

FIG. 10 is a top view illustrating an example of a configuration including a power supply unit of an optical receiver according to the first embodiment. In FIG. 10, parts similar to the parts illustrated in FIGS. 1 to 7 are identified by the same reference numerals, and description thereof will be omitted. As illustrated in FIG. 10, the optical receiver 100 according to the first embodiment may include a bypass capacitor 1010, a ground line 1020, and a ground line 1030 in addition to the configuration illustrated in FIGS. 1 to 7.

In addition, the bias line 160 may be formed to an edge portion 1001 of the printed board 110. External power (bias) is supplied to a portion of the bias line 160, the portion being formed on the edge portion 1001, for example. In addition, as in the example illustrated in FIG. 10, the bias line 160 may supply power to each of the side of the cathode line 132 of the PD array 120 and the TIA array 150 by branching.

The bypass capacitor 1010 is formed on the top surface of the printed board 110. The bypass capacitor 1010 is a capacitor having one terminal coupled to the bias line 160, and having another terminal coupled to the ground line 1020. During operation of the PDs 121a to 121d and the TIA array 150, the bypass capacitor 1010 lets a noise component (high-frequency component) of the bias line 160 escape to the ground line 1020, and thus suppresses variation of the direct current in the bias line 160. As an example, the bypass capacitor 1010 may be a multilayer chip capacitor as with the bypass capacitor 170.

The ground line 1020 is formed on the top surface of the printed board 110. The ground line 1020 is electric wiring coupled to a ground line on the undersurface of the printed board 110 via a via 1021 (see FIG. 11, for example). The ground line 1030 is formed on the top surface of the printed board 110. The ground line 1030 is electric wiring coupled to the ground line 410 on the undersurface of the printed board 110 via a via 1031 (see FIG. 11, for example). An external ground is, for example, coupled to the ground line 1030.

In addition, the bias line 160 is disposed so as to be separated from the anode lines 131a to 131d. This may suppress voltage variation occurring in the bias line 160 from occurring also in the anode lines 131a to 131d due to capacitive coupling.

(Undersurface of Optical Receiver According to First Embodiment)

Figure 11:
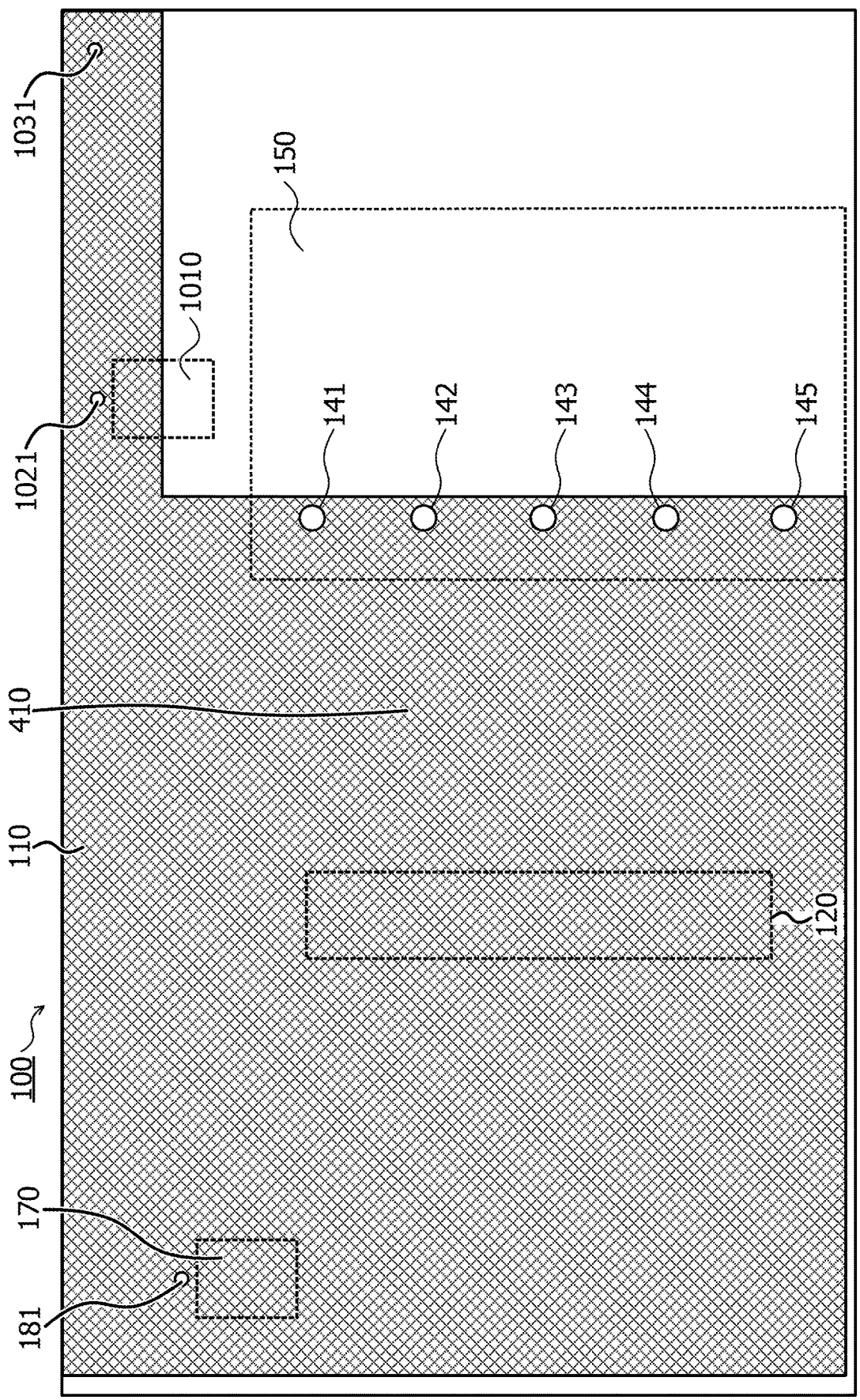
FIG. 11 is a bottom view illustrating an undersurface of one example of an optical receiver according to the first embodiment.

FIG. 11 is a bottom view illustrating an undersurface of one example of an optical receiver according to the first embodiment. In FIG. 11, parts similar to the parts illustrated in FIGS. 1 to 7 and FIG. 10 are identified by the same reference numerals, and description thereof will be omitted. As illustrated in FIG. 11, the ground line 410 is, for example, disposed on the undersurface of a region including respective positions at which the vias 141 to 145, 181, 1021, and 1031 and the cathode line 132 (see FIG. 1 and the like) are arranged in the printed board 110.

Thus, the ground electrode 140 (see FIG. 1 and FIG. 2, for example) and the ground lines 180, 1020, and 1030 (see FIG. 10, for example) may be coupled to the ground line 410. In addition, a capacitance may be formed by the cathode line 132 and the ground line 410. However, the disposition of the ground line 410 illustrated in FIG. 11 is an example. For example, the ground line 410 may be disposed on the whole of the undersurface of the printed board 110, or a part of the ground line 410 illustrated in FIG. 11 may be omitted.

Incidentally, in the example illustrated in FIG. 10 and FIG. 11, description has been made of a configuration in which an external ground is coupled to the ground line 1030 on the top surface side of the printed board 110. However, a configuration may be adopted in which the external ground is directly coupled to the ground line 410 on the undersurface of the printed board 110. In this case, the ground line 1030 and the via 1031 may be omitted.

(Optical Transceiver According to First Embodiment)

Figure 12:
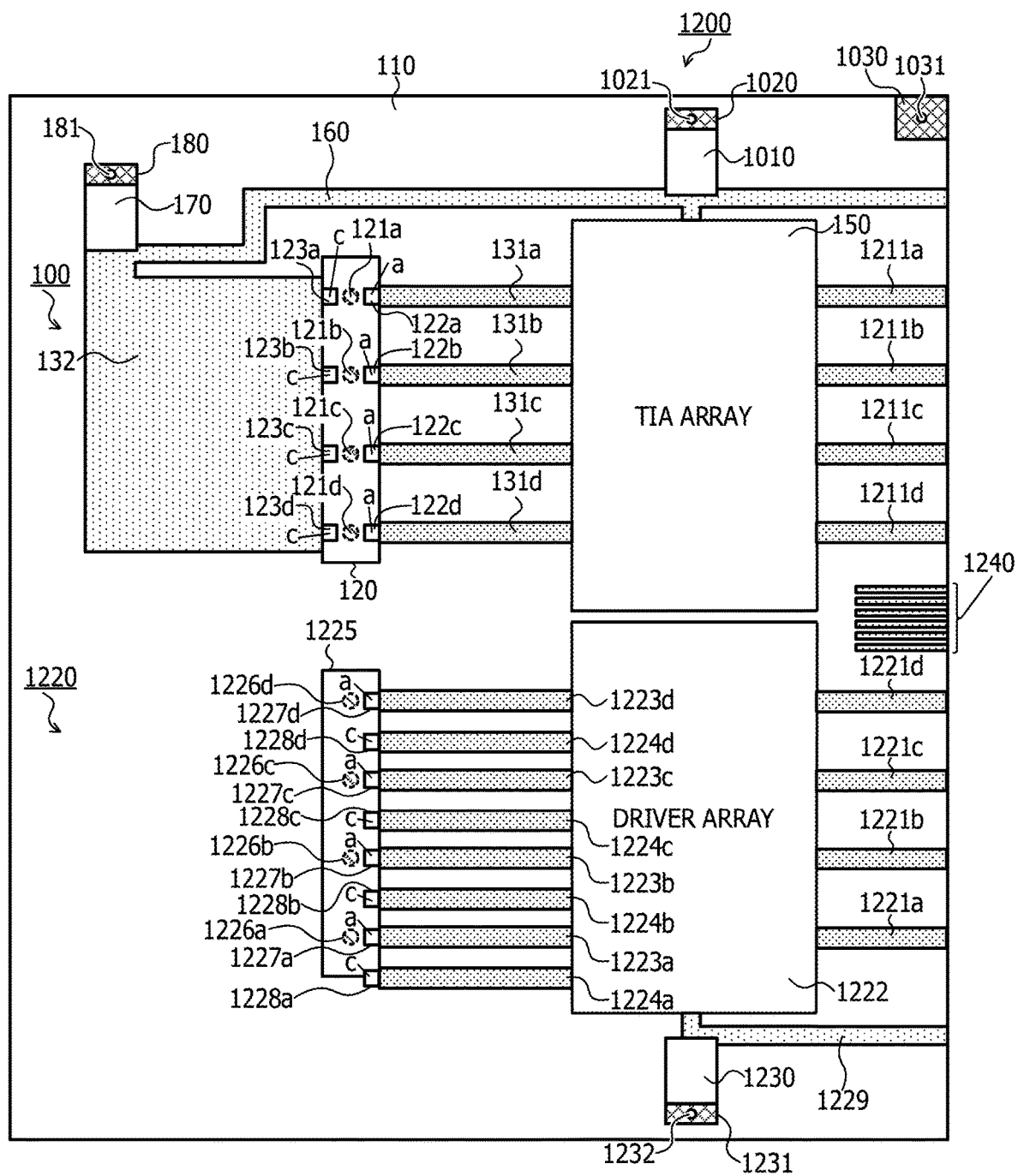
FIG. 12 is a top view illustrating an example of an optical transceiver according to the first embodiment.

FIG. 12 is a top view illustrating an example of an optical transceiver according to the first embodiment. In FIG. 12, parts similar to the parts illustrated in FIG. 1 are identified by the same reference numerals, and description thereof will be omitted. As illustrated in FIG. 12, an optical transceiver 1200 according to the first embodiment includes the optical receiver 100, an optical transmitter 1220, and a control and monitoring terminal group 1240. The optical transceiver 1200 according to the first embodiment is a four-channel transceiver in which the four-channel optical receiver 100 and the four-channel optical transmitter 1220 form a pair. Supposing that a band per channel is 25 [Gbps], for example, the optical transceiver 1200 is an optical transmission device that operates at 100 [Gbps] with 25 [Gbps]×four channels.

The optical receiver 100 includes signal lines 1211a to 1211d in addition to the configuration illustrated in FIG. 10, for example. For example, the TIA array 150 converts an electric signal output from the anode line 131a into a voltage signal, and outputs the converted voltage signal from the signal line 1211a. Similarly, the TIA array 150 converts electric signals respectively output from the anode lines 131b to 131d into voltage signals, and outputs the converted voltage signals to the signal lines 1211b to 1211d, respectively. The signal lines 1211b to 1211d are each formed on the top surface of the printed board 110, and output the voltage signals output from the TIA array 150.

The optical transmitter 1220 includes signal lines 1221a to 1221d, a driver array 1222, anode lines 1223a to 1223d, cathode lines 1224a to 1224d, and an LD array 1225. The optical transmitter 1220 also includes a bias line 1229, a bypass capacitor 1230, and a ground line 1231. LD is an abbreviation of Laser Diode.

These configurations of the optical transmitter 1220 are arranged on the same printed board 110 as the optical receiver 100, for example. The signal lines 1221a to 1221d are each formed on the top surface of the printed board 110, and output input voltage signals to the driver array 1222.

The driver array 1222 is bump-coupled to the top surface of the printed board 110. The driver array 1222 converts a voltage signal output from the signal line 1221a, for example, into a current signal, and outputs the converted current signal to the LD array 1225 via the anode line 1223a. Similarly, the driver array 1222 converts voltage signals respectively output from the signal lines 1221b to 1221d into current signals, and outputs the converted current signals to the LD array 1225 via the anode lines 1223b to 1223d, respectively.

The anode lines 1223a to 1223d are formed on the top surface of the printed board 110. The anode lines 1223a to 1223d are electric wiring that respectively couples the driver array 1222 to anodes 1227a to 1227d of the LD array 1225. Intervals between the anode lines 1223a to 1223d may be set to be approximately 0.25 [mm], for example.

The cathode lines 1224a to 1224d are formed on the top surface of the printed board 110. The cathode lines 1224a to 1224d are electric wiring respectively coupled to cathodes 1228a to 1228d of the LD array 1225. In the example illustrated in FIG. 12, the cathode lines 1224a to 1224d are electrodes common to the cathodes 1228a to 1228d. In addition, the cathode lines 1224a to 1224d are arranged in parallel with the anode lines 1223a to 1223d.

The LD array 1225 is bump-coupled to the top surface of the printed board 110. The LD array 1225 includes a plurality of LDs arranged in a one-dimensional manner. In the example illustrated in FIG. 12, the LD array 1225 is an LD array corresponding to four channels, and includes LDs 1226a to 1226d. The LDs 1226a to 1226d respectively oscillate according to the current signals input to the anodes 1227a to 1227d, and emit light obtained by the oscillation from an optical waveguide. As an example, each of the LDs 1226a to 1226d is a VCSEL. VCSEL is an abbreviation of Vertical Cavity Surface Emitting Laser (vertical resonator surface light emitting laser).

The anodes 1227a to 1227d are anodes (positive electrodes) of the LDs 1226a to 1226d, respectively. The cathodes 1228a to 1228d are cathodes (negative electrodes) of the LDs 1226a to 1226d, respectively. In addition, the cathodes 1228a to 1228d are disposed on the same side as the anodes 1227a to 1227d in the LD array 1225.

The bias line 1229 is formed on the top surface of the printed board 110. The bias line 1229 is electric wiring that supplies a bias voltage from a bias power supply to the LDs 1226a to 1226d via the cathode lines 1224a to 1224d. In addition, the bias line 1229 is electric wiring common to the LDs 1226a to 1226d (respective channels).

The bypass capacitor 1230 is formed on the top surface of the printed board 110. The bypass capacitor 1230 is a capacitor having one terminal coupled to the bias line 1229, and having another terminal coupled to the ground line 1231. During operation of the LDs 1226a to 1226d, the bypass capacitor 1230 lets a noise component (high-frequency component) of the bias line 1229 escape to the ground line 1231, and thus suppresses variation of a direct current in the bias line 1229. As an example, the bypass capacitor 1230 may be a multilayer chip capacitor formed by stacking a large number of dielectrics such as titanium oxide, barium titanate, or the like and electrodes.

The ground line 1231 is formed on the top surface of the printed board 110. The ground line 1231 is electric wiring coupled to a ground line (for example, the ground line 410) on the undersurface of the printed board 110 via a via 1232.

The control and monitoring terminal group 1240 includes, for example, a control line to which a control signal for controlling the optical transceiver 1200 is input, a monitoring line from which a monitoring signal for monitoring the optical transceiver 1200 is output, and the like.

(Optical Transmission Device in which Optical Transceiver According to First Embodiment is Implemented)

Figure 13:
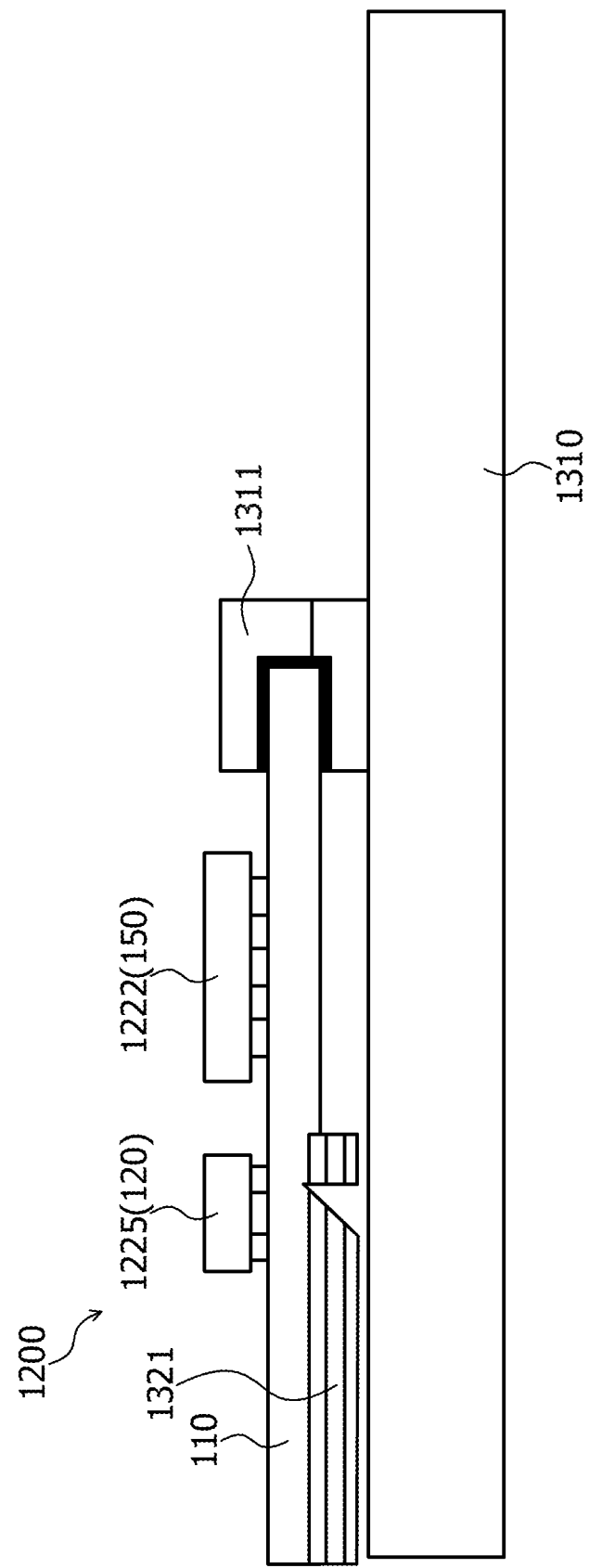
FIG. 13 is a sectional view illustrating an example of an optical transmission device in which an optical transceiver according to the first embodiment is implemented.

FIG. 13 is a sectional view illustrating an example of an optical transmission device in which an optical transceiver according to the first embodiment is implemented. The optical transceiver 1200 illustrated in FIG. 12 may be implemented on a board 1310, as illustrated in FIG. 13, for example. An electric connector 1311 is disposed on the board 1310. The electric connector 1311 is coupled with an edge portion of the optical transceiver 1200. The signal lines 1211a to 1211d and 1221a to 1221d and the control and monitoring terminal group 1240 are disposed on the edge portion. The optical transceiver 1200 may be thereby electrically coupled to the board 1310.

An optical waveguide 1321 is, for example, disposed on an undersurface side of the optical transceiver 1200. The optical waveguide 1321, for example, includes a waveguide that emits light emitted from the LDs 1226a to 1226d of the LD array 1225 to the outside. The optical waveguide 1321 also includes a waveguide that makes externally incident light incident on the PDs 121a to 121d of the PD array 120.

(Another Example of Optical Receiver According to First Embodiment)

Figure 14:
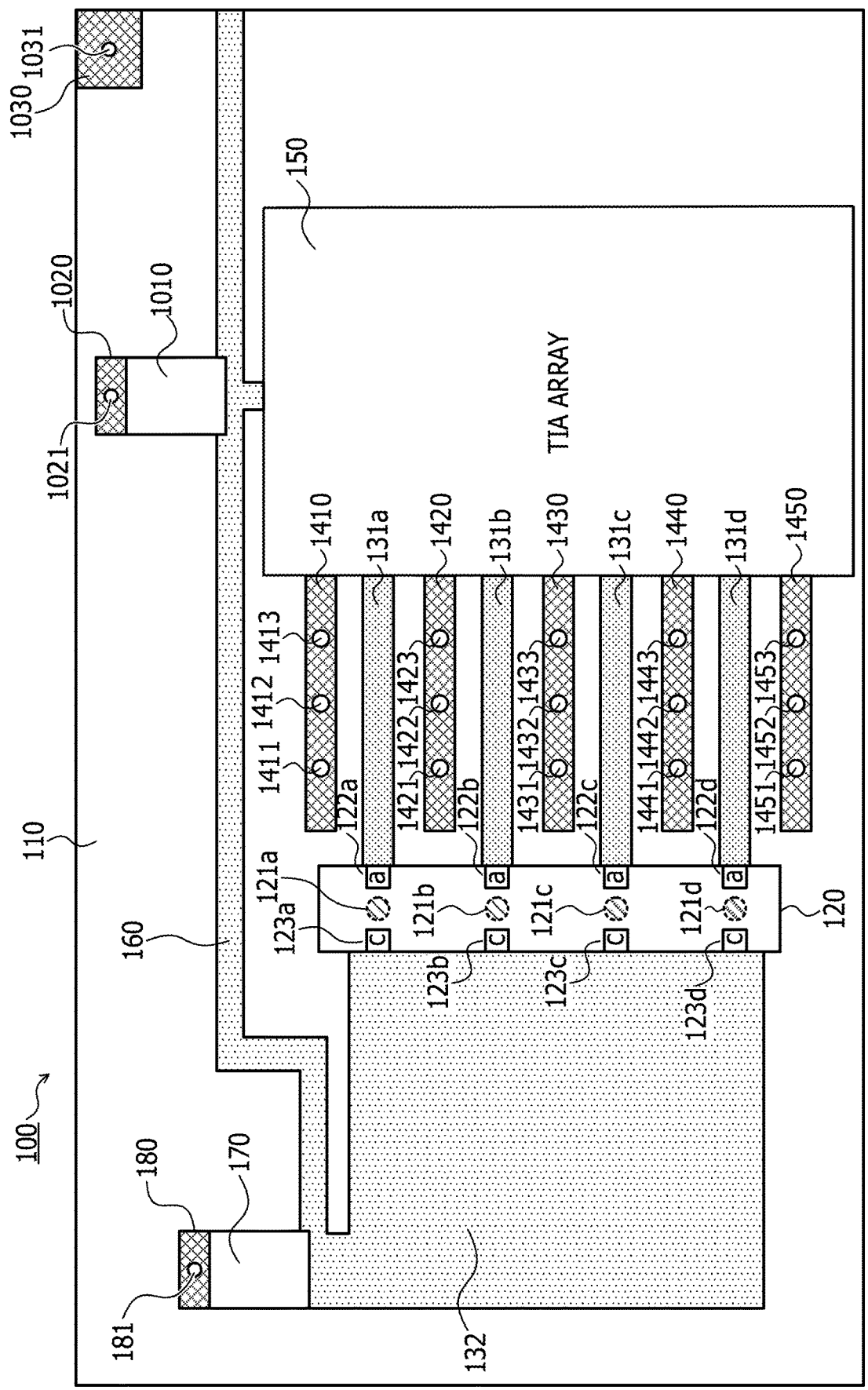
FIG. 14 is a top view illustrating another example of an optical receiver according to the first embodiment.
Figure 15:
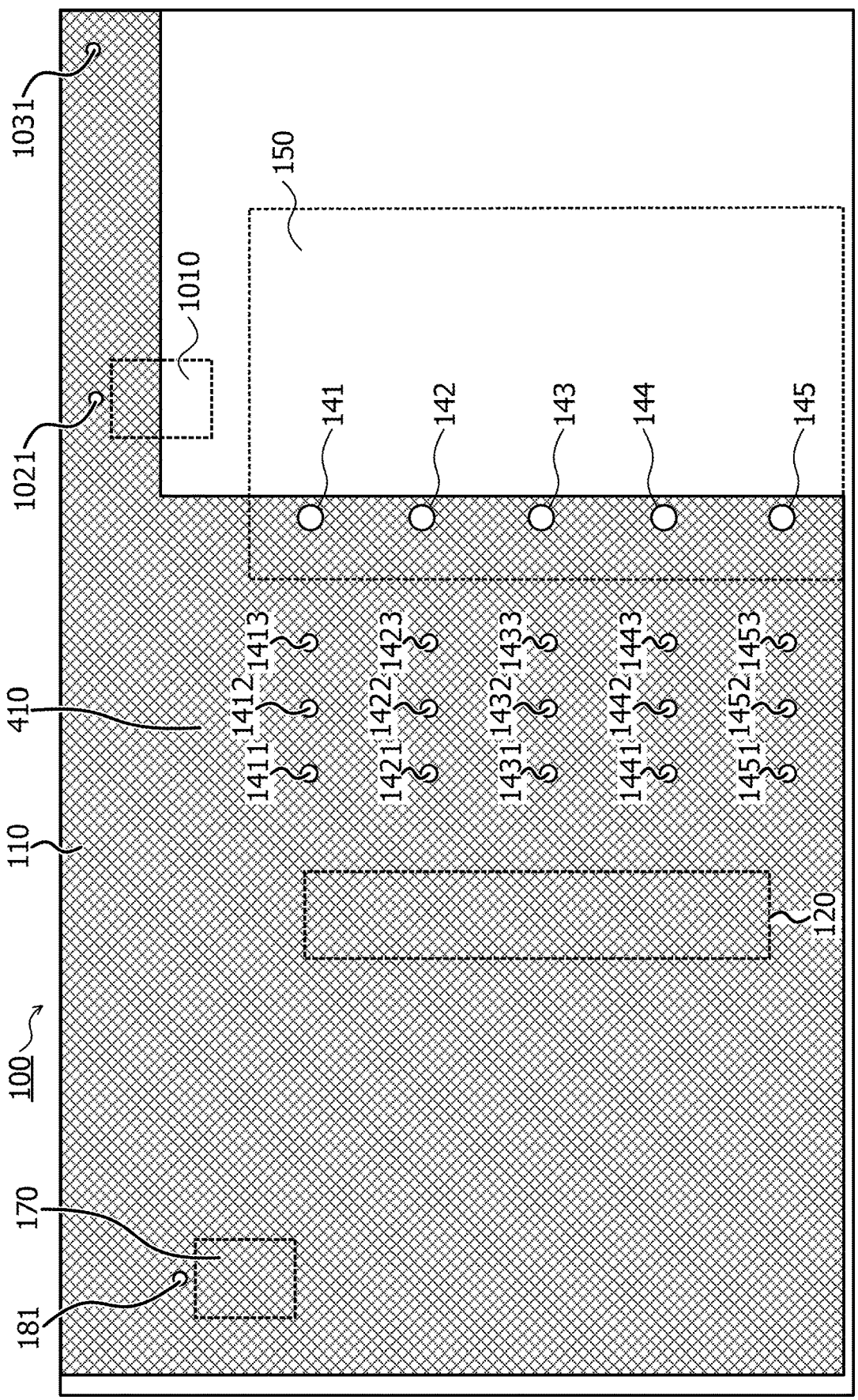
FIG. 15 is a bottom view illustrating an undersurface of another example of an optical receiver according to the first embodiment.

FIG. 14 is a top view illustrating another example of an optical receiver according to the first embodiment. FIG. 15 is a bottom view illustrating an undersurface of another example of an optical receiver according to the first embodiment. In FIG. 14 and FIG. 15, parts similar to the parts illustrated in FIG. 10 and FIG. 11 are identified by the same reference numerals, and description thereof will be omitted. As illustrated in FIG. 14 and FIG. 15, the optical receiver 100 may, for example, include ground lines 1410, 1420, 1430, 1440, and 1450 formed on the top surface of the printed board 110 in addition to the configuration illustrated in FIG. 10 and FIG. 11.

The ground line 1410 is disposed on the bias line 160 side of the anode line 131a so as to be in parallel with the anode line 131a, and is coupled to the ground line 410 on the undersurface via vias 1411 to 1413. The ground line 1420 is disposed between the anode lines 131a and 131b so as to be in parallel with the anode lines 131a and 131b, and is coupled to the ground line 410 on the undersurface via vias 1421 to 1423.

The ground line 1430 is disposed between the anode lines 131b and 131c so as to be in parallel with the anode lines 131b and 131c, and is coupled to the ground line 410 on the undersurface via vias 1431 to 1433. The ground line 1440 is disposed between the anode lines 131c and 131d so as to be in parallel with the anode lines 131c and 131d, and is coupled to the ground line 410 on the undersurface via vias 1441 to 1443.

The ground line 1450 is disposed on an opposite side of the anode line 131d from the ground line 1440 so as to be in parallel with the anode line 131d, and is coupled to the ground line 410 on the undersurface via vias 1451 to 1453.

When the ground lines 1410, 1420, 1430, 1440, and 1450 serving as shields are disposed on the sides of the anode lines 131a to 131d as illustrated in FIG. 14 and FIG. 15, crosstalk tolerance of the anode lines 131a to 131d as transmission lines may be improved.

For example, crosstalk tolerance may be improved by arranging the ground lines 1420, 1430, and 1440 as shields between the anode lines 131a to 131d. In addition, respective characteristics of the anode lines 131a to 131d may be made uniform by arranging the ground lines 1410 and 1450.

Figure 16:
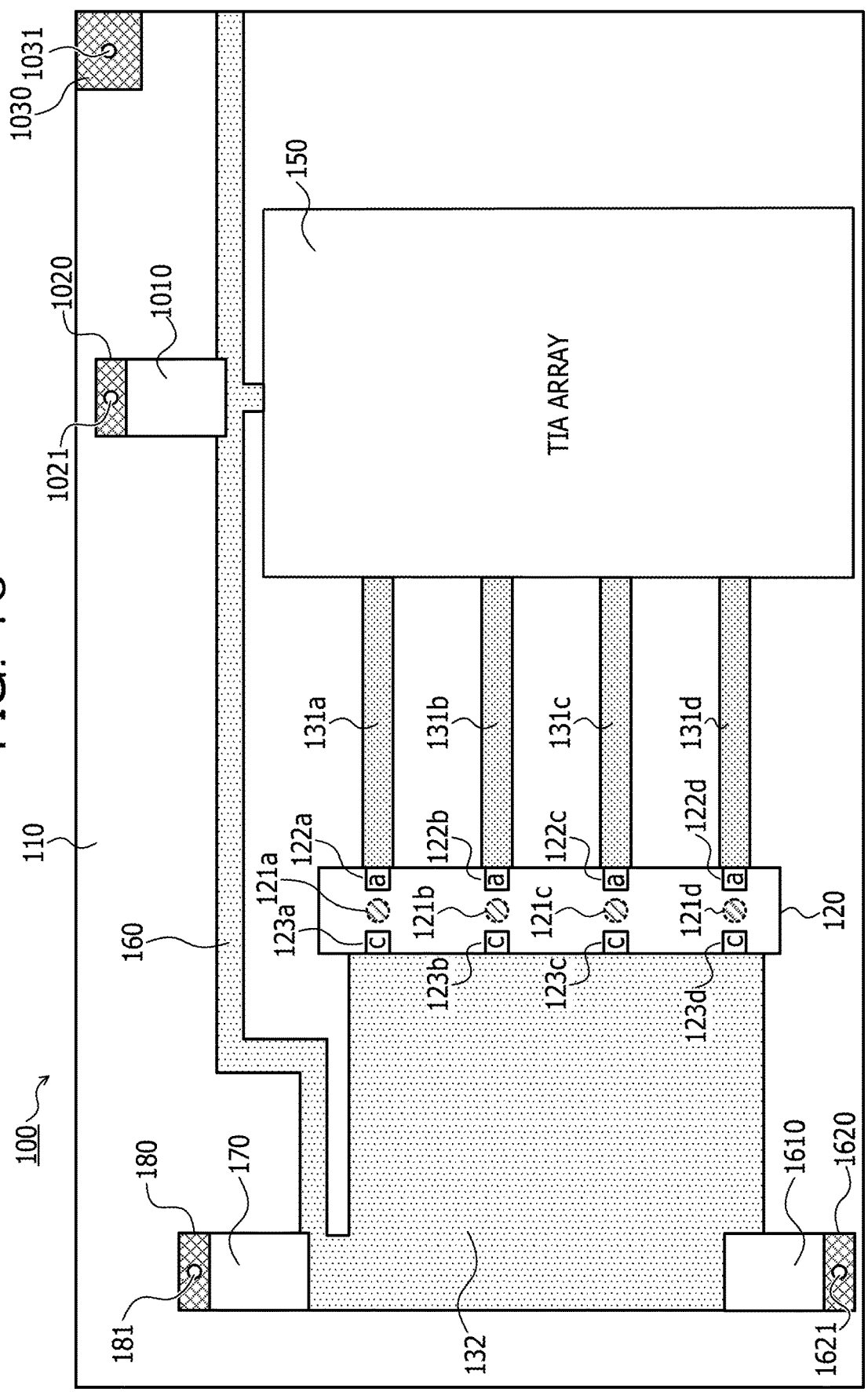
FIG. 16 is a top view illustrating yet another example of an optical receiver according to the first embodiment.
Figure 17:
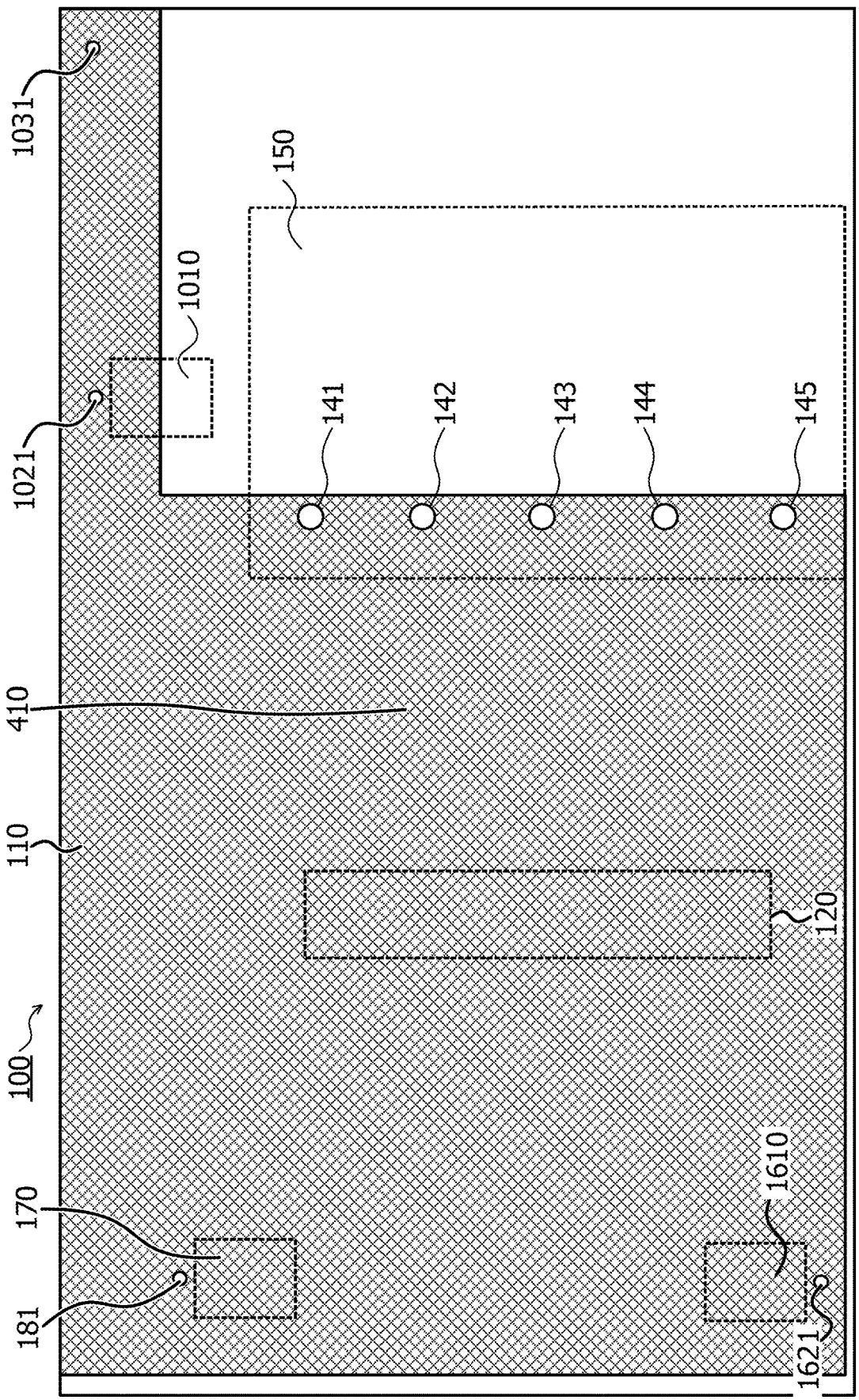
FIG. 17 is a bottom view illustrating an undersurface of yet another example of an optical receiver according to the first embodiment.

FIG. 16 is a top view illustrating yet another example of an optical receiver according to the first embodiment. FIG. 17 is a bottom view illustrating an undersurface of yet another example of an optical receiver according to the first embodiment. In FIG. 16 and FIG. 17, parts similar to the parts illustrated in FIG. 10 and FIG. 11 are identified by the same reference numerals, and description thereof will be omitted. As illustrated in FIG. 16 and FIG. 17, the optical receiver 100 may, for example, include a bypass capacitor 1610 and a ground line 1620 in addition to the configuration illustrated in FIG. 10 and FIG. 11.

The bypass capacitor 1610 is a capacitor having one terminal coupled to a position of the cathode line 132, the position being different from that of the bypass capacitor 170, and having another terminal coupled to the ground line 1620. During operation of the PDs 121a to 121d, the bypass capacitor 1610 lets a noise component (high-frequency component) of the bias line 160 escape to the ground line 1620, and thus suppresses variation of a direct current in the bias line 160. As an example, as with the bypass capacitor 170, the bypass capacitor 1610 may be a multilayer chip capacitor formed by stacking a large number of dielectrics such as titanium oxide, barium titanate, or the like and electrodes. The ground line 1620 is formed on the top surface of the printed board 110. The ground line 1620 is electric wiring coupled to the ground line 410 on the undersurface of the printed board 110 via a via 1621.

As illustrated in FIG. 16 and FIG. 17, a plurality of bypass capacitors (bypass capacitors 170 and 1610) for the bias of the PDs 121a to 121d may be arranged in parallel with each other. For example, the one terminals of the plurality of bypass capacitors may be coupled to different positions of the cathode line 132, and the other terminals of the same plurality of bypass capacitors may be coupled to the ground line 410. Consequently, inductor components within the bypass capacitors 170 and 1610 may be reduced, and thus high-frequency characteristics may be improved. While description has been made of a configuration in which two bypass capacitors (bypass capacitors 170 and 1610) are disposed for the bias in the example illustrated in FIG. 16 and FIG. 17, three or more bypass capacitors may be disposed for the bias.

In addition, the ground lines 1410, 1420, 1430, 1440, and 1450 may be arranged on the sides of the anode lines 131a to 131d as illustrated in FIG. 14 and FIG. 15 in the configuration illustrated in FIG. 16 and FIG. 17.

Thus, the optical receiver 100 according to the first embodiment includes the anode lines 131a to 131d of the PDs 121a to 121d in a region between the PD array 120 and the TIA array 150. In addition, the optical receiver 100 includes the cathode line 132 of the PDs 121a to 121d in a region different from the region between the PD array 120 and the TIA array 150. Thus, voltage variation of the cathode line 132 due to variation of the bias power supply may be interrupted by the capacitance of the PDs 121a to 121d, so that voltage variation in the input of each TIA of the TIA array 150 may be suppressed. Therefore, crosstalk between the channels in the TIA array 150 may be suppressed.

In addition, the optical receiver 100 according to the first embodiment includes the ground line 410 that is disposed on the undersurface of a region having the cathode line 132 disposed on the top surface thereof in the printed board 110, and is coupled to each TIA of the TIA array 150. Thus, high-frequency components of the return currents may be bypassed to the ground line 410 by the capacitance formed by the cathode line 132 and the ground line 410. Therefore, even in the configuration using a capacitor having an inferior high-frequency characteristic such as a multilayer chip capacitor or the like as the bypass capacitor 170, a degradation in the high-frequency characteristics of the return currents may be suppressed.

In addition, the optical receiver 100 according to the first embodiment may include the ground lines 1420, 1430, and 1440 arranged between the anode lines 131a to 131d so as to be in parallel with the anode lines 131a to 131d. The ground lines 1420, 1430, and 1440 thereby serve as shields, and may suppress crosstalk between the anode lines 131*a* to 131*d*.

In addition, the optical receiver 100 according to the first embodiment may include a plurality of bypass capacitors (bypass capacitors 170 and 1610) arranged in parallel with each other. It is thereby possible to reduce inductor components within the bypass capacitors 170 and 1610, and thus improve high-frequency characteristics.

In addition, in the optical receiver 100 according to the first embodiment, the anodes 122*a* to 122*d* of the PDs 121*a* to 121*d* and the cathodes 123*a* to 123*d* of the PDs 121*a* to 121*d* may be arranged on opposite sides from each other in the PD array 120. This facilitates wiring that disposes the above-described cathode line 132 of the PDs 121*a* to 121*d* in a region different from the region between the PD array 120 and the TIA array 150.

Second Embodiment

For a second embodiment, parts different from the first embodiment will be described. In the second embodiment, description will be made of a configuration in which the cathode line of the PD array 120 couples the cathodes 123*a* to 123*d* to the bias power supply and the bypass capacitor 170 via resistances, and further includes a plurality of cathode lines corresponding to the cathodes 123*a* to 123*d*.

(Optical Receiver According to Second Embodiment)

Figure 18:
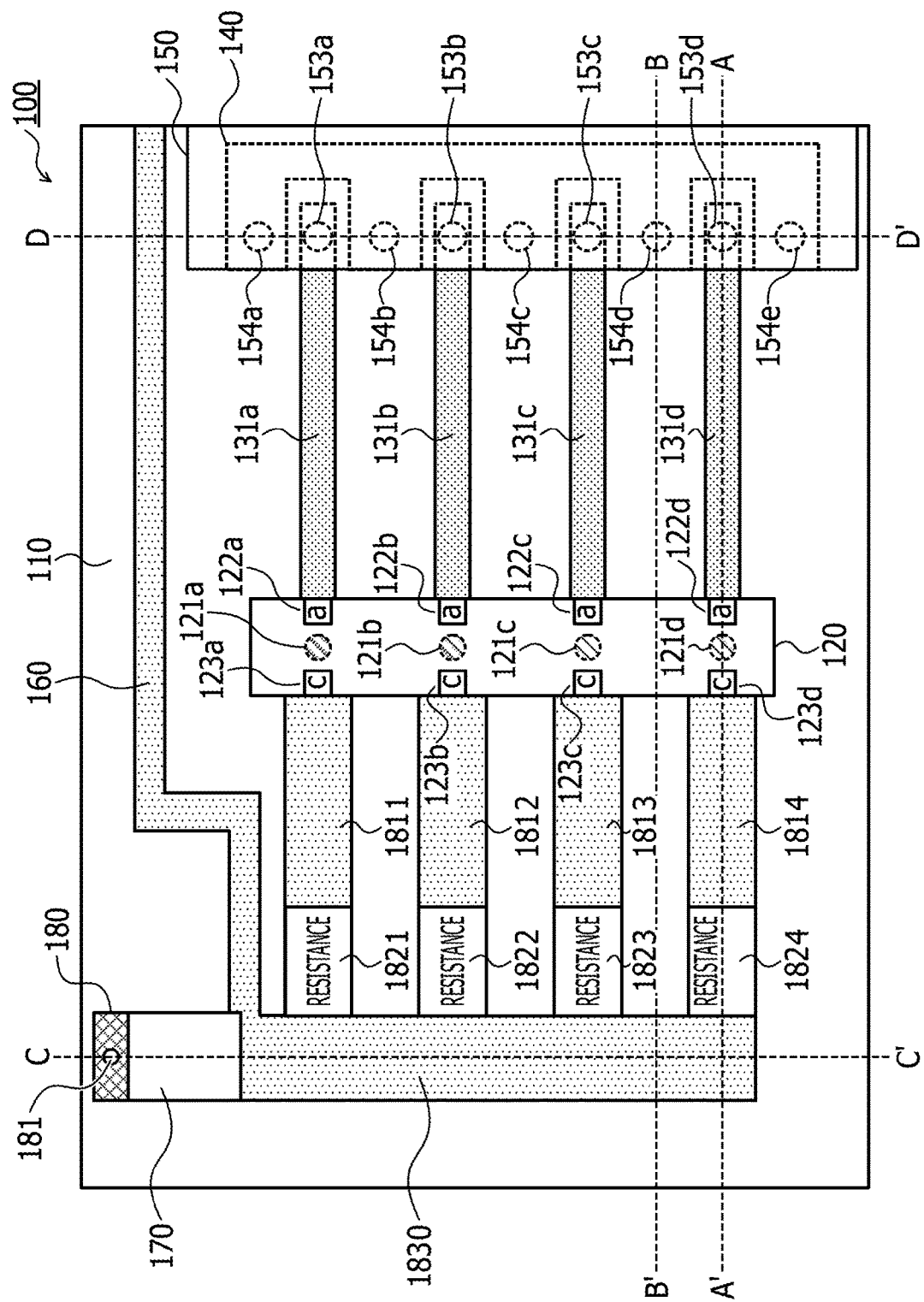
FIG. 18 is a top view illustrating one example of an optical receiver according to a second embodiment.

FIG. 18 is a top view illustrating one example of an optical receiver according to the second embodiment. In FIG. 18, parts similar to the parts illustrated in FIG. 1 are identified by the same reference numerals, and description thereof will be omitted. As illustrated in FIG. 18, the optical receiver 100 according to the second embodiment includes cathode lines 1811 to 1814 and 1830 and resistances 1821 to 1824 in place of the cathode line 132 illustrated in FIG. 1, for example.

The cathode lines 1811 to 1814 are formed on the top surface of the printed board 110. The cathode lines 1811 to 1814 are electric wiring that is coupled to the cathodes 123*a* to 123*d* of the PDs 121*a* to 121*d*, respectively, and is independent on a channel-by-channel basis (not coupled to each other). The cathode line 1811, for example, has one end coupled to the cathode 123*a*, and has another end coupled to the resistance 1821. Similarly, the cathode lines 1812 to 1814 have one ends coupled to the cathodes 123*b* to 123*d*, respectively, and have other ends coupled to the resistances 1822 to 1824, respectively. Respective intervals between the cathode lines 1811 to 1814 may be set to be approximately 0.25 [mm], for example.

The resistances 1821 to 1824 are resistive elements coupled to the top surface of the printed board 110 by solder or the like. The resistance 1821, for example, has one terminal coupled to the cathode line 1811, and has another terminal coupled to the cathode line 1830. Similarly, the resistances 1822 to 1824 have one terminals coupled to the cathode lines 1812 to 1814, respectively, and have other terminals coupled to the cathode line 1830. Each of the resistances 1821 to 1824 may be a resistive element of approximately 50 to 200 [ohm], for example.

The cathode line 1830 is formed on the top surface of the printed board 110. The cathode line 1830 is electric wiring coupled to the bias line 160 and the bypass capacitor 170, and also coupled to the cathode lines 1811 to 1814 via the resistances 1821 to 1824, respectively.

As illustrated in FIG. 18, the resistances 1821 to 1824 are respectively arranged between the cathode lines (cathode lines 1811 to 1814) coupled to the cathodes 123*a* to 123*d* and the bypass capacitor 170. Thus, it is possible to suppress parallel resonance (voltage oscillation in a common power supply) and series resonance (current assumes a maximal value) due to the fact that the optical receiver 100 is a multichannel (four-channel) receiver, and to thereby suppress crosstalk between the channels. Incidentally, if the optical receiver 100 is a single-channel optical receiver, a frequency characteristic becomes flat due to a low-pass characteristic in a first circuit stage, and therefore the parallel resonance and the series resonance described above do not occur.

In addition, the cathode lines coupled to the cathodes 123*a* to 123*d* of the PDs 121*a* to 121*d* are the cathode lines 1811 to 1814 independent on a channel-by-channel basis. Thus, in the configuration arranged in the resistances 1821 to 1824, voltage variation of Cathode Line Resistance Value×Current Value (IR) may be suppressed from becoming crosstalk.

In addition, the cathode line 1830 coupled to the cathode lines 1811 to 1814 via the resistances 1821 to 1824, respectively, are made common to the channels. It is thereby possible to suppress variation between the channels due to the wiring of a DC bias to the PDs 121*a* to 121*d*.

Figure 19:
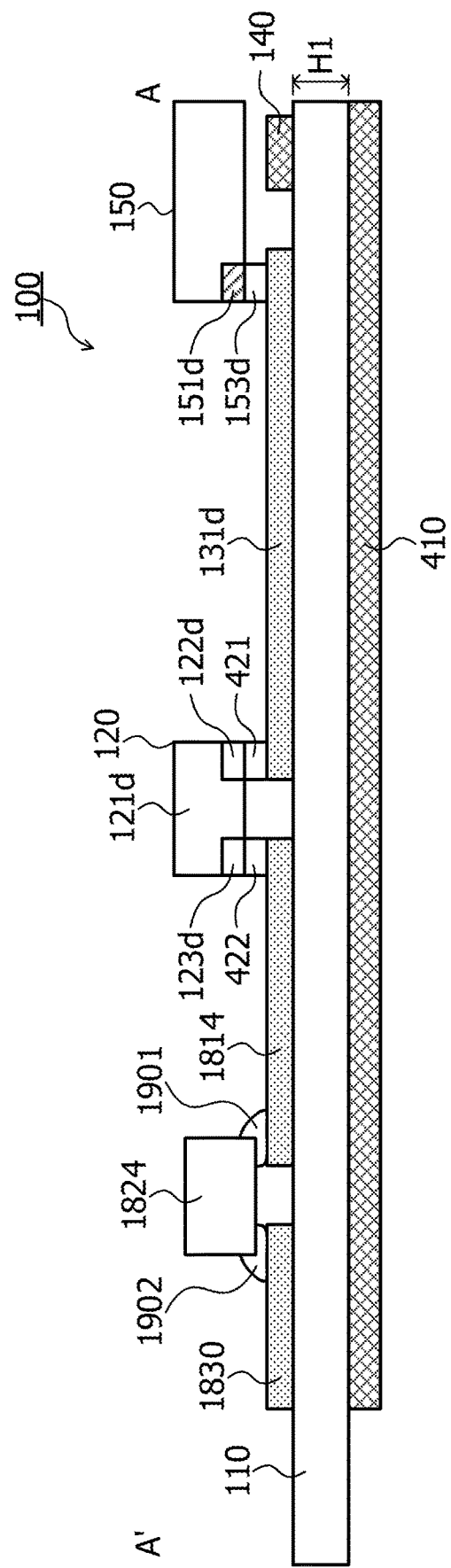
FIG. 19 is a sectional view taken along a line A-A', the sectional view illustrating one example of an optical receiver according to the second embodiment.

FIG. 19 is a sectional view taken along a line A-A', the sectional view illustrating one example of an optical receiver according to the second embodiment. In FIG. 19, parts similar to the parts illustrated in FIG. 4 and FIG. 18 are identified by the same reference numerals, and description thereof will be omitted. As illustrated in FIG. 19, in the optical receiver 100 according to the second embodiment, the resistance 1824, for example, has one terminal coupled to the cathode line 1814 by a solder 1901, and has another terminal coupled to the cathode line 1830 by a solder 1902.

Figure 20:
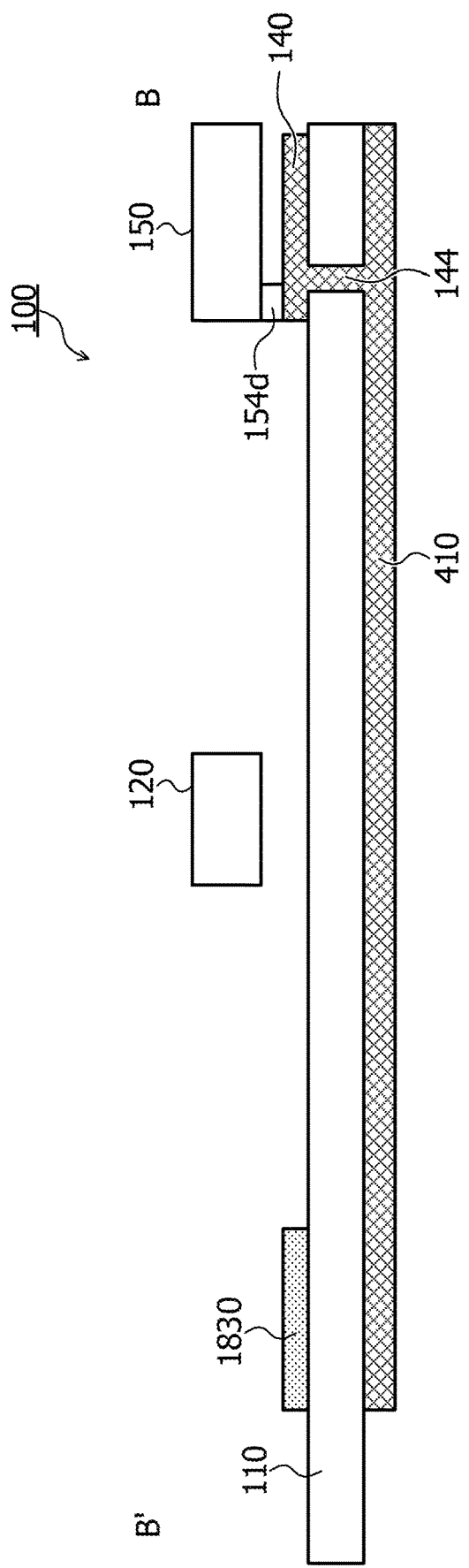
FIG. 20 is a sectional view taken along a line B-B', the sectional view illustrating one example of an optical receiver according to the second embodiment.

FIG. 20 is a sectional view taken along a line B-B', the sectional view illustrating one example of an optical receiver according to the second embodiment. In FIG. 20, the parts similar to the parts illustrated in FIG. 5 and FIG. 18 are identified by the same reference numerals, and description thereof will be omitted. As described above, the cathode lines 1811 to 1814 coupled to the cathodes 123*a* to 123*d* are independent on a channel-by-channel basis. There is thus no cathode line between the PDs 121*a* to 121*d* and the cathode line 1830 in the B-B' section of the optical receiver 100.

Figure 21:
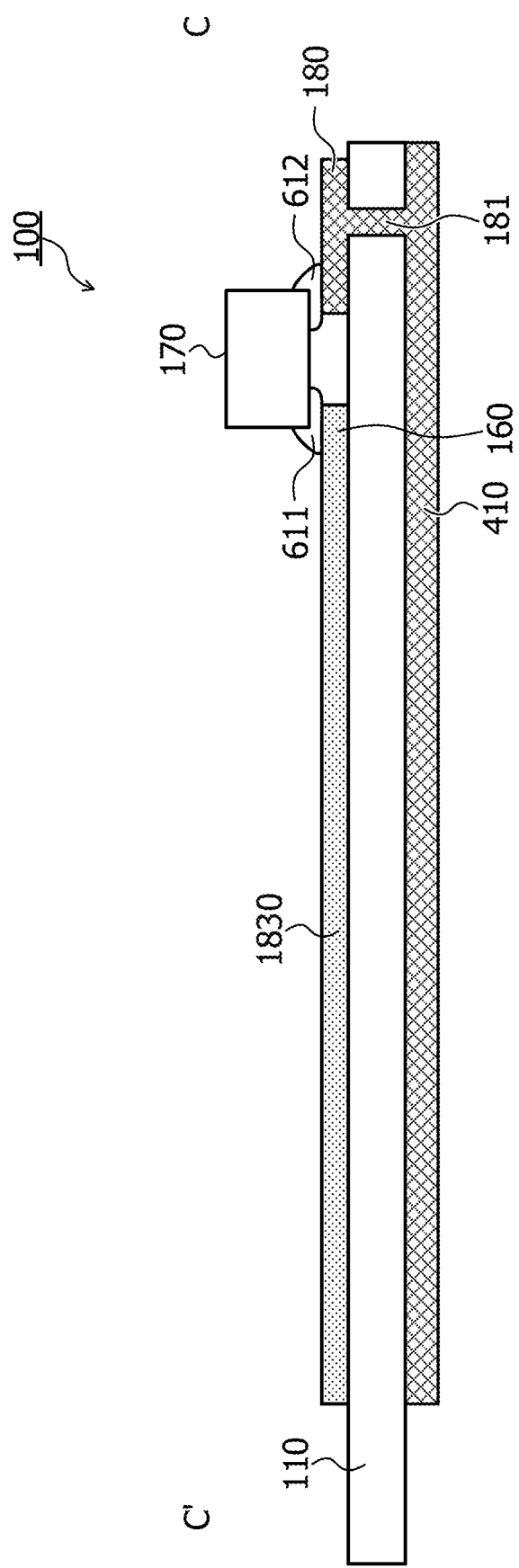
FIG. 21 is a sectional view taken along a line C-C', the sectional view illustrating one example of an optical receiver according to the second embodiment.

FIG. 21 is a sectional view taken along a line C-C', the sectional view illustrating one example of an optical receiver according to the second embodiment. In FIG. 21, parts similar to the parts illustrated in FIG. 6 and FIG. 18 are identified by the same reference numerals, and description thereof will be omitted. As described above, the cathode line 1830 coupled to the cathode lines 1811 to 1814 via the resistances 1821 to 1824, respectively, is common to the channels. Therefore, the cathode line 1830 is disposed on the whole of a region corresponding to each channel in the C-C' section of the optical receiver 100.

A sectional view taken along a line D-D' in the optical receiver 100 according to the second embodiment is similar to FIG. 7, for example.

(Frequency Characteristic of Optical Receiver According to Second Embodiment)

Figure 22:
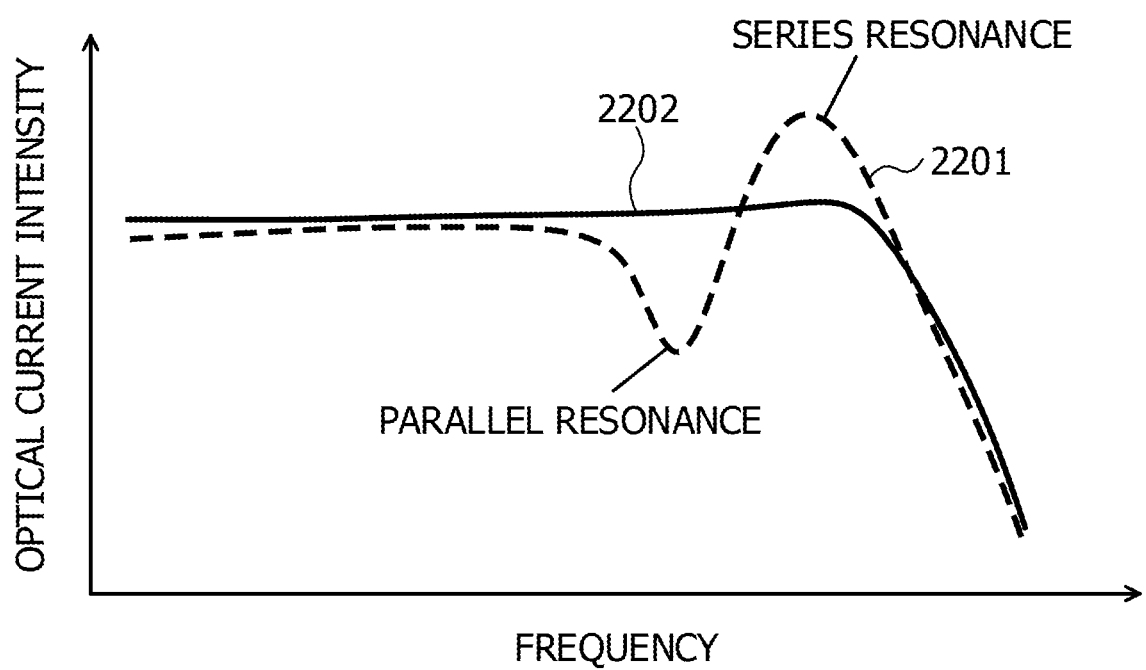
FIG. 22 is a graph illustrating an example of a frequency characteristic of an optical receiver according to the second embodiment.

FIG. 22 is a graph illustrating an example of a frequency characteristic of an optical receiver according to the second embodiment. In FIG. 22, an axis of abscissas indicates frequency, and an axis of ordinates indicates optical current intensity. A frequency characteristic 2201 represents a characteristic of optical current intensity with respect to frequency in the multichannel optical receiver 100 on which the resistances 1821 to 1824 are not arranged (for example, the optical receiver 100 illustrated in FIG. 1 and the like). A frequency characteristic 2202 represents a characteristic of optical current intensity with respect to frequency in the multichannel optical receiver 100 on which the resistances 1821 to 1824 are arranged (for example, the optical receiver 100 illustrated in FIG. 18 and the like).

As indicated by the frequency characteristic 2201, in the case where the resistances 1821 to 1824 are not arranged in the multichannel optical receiver 100, a minimal value due to the above-described parallel resonance and a maximal value due to the above-described series resonance occur in the characteristic of optical current intensity with respect to frequency.

On the other hand, in the optical receiver 100 according to the second embodiment, the resistances 1821 to 1824 are arranged on the optical receiver 100, and the optical receiver 100 may thereby suppress the minimal value of optical current intensity due to the above-described parallel resonance and the maximal value of optical current intensity due to the above-described series resonance, as indicated by the frequency characteristic 2202. It is thereby possible to flatten the frequency characteristic 2202, and suppress crosstalk between the channels.

(Another Example of Optical Receiver According to Second Embodiment)

Figure 23:
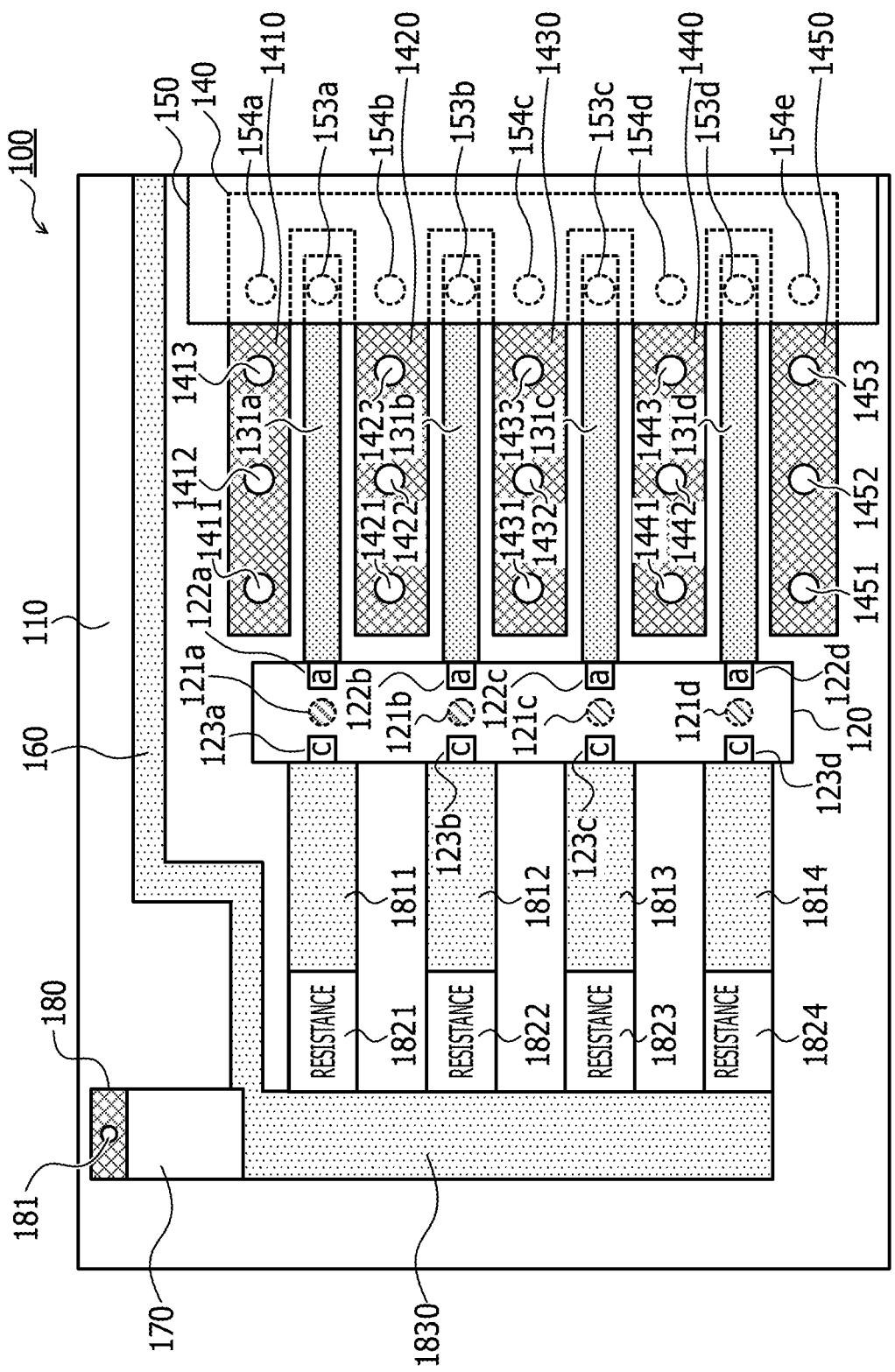
FIG. 23 is a top view illustrating another example of an optical receiver according to the second embodiment.
Figure 24:
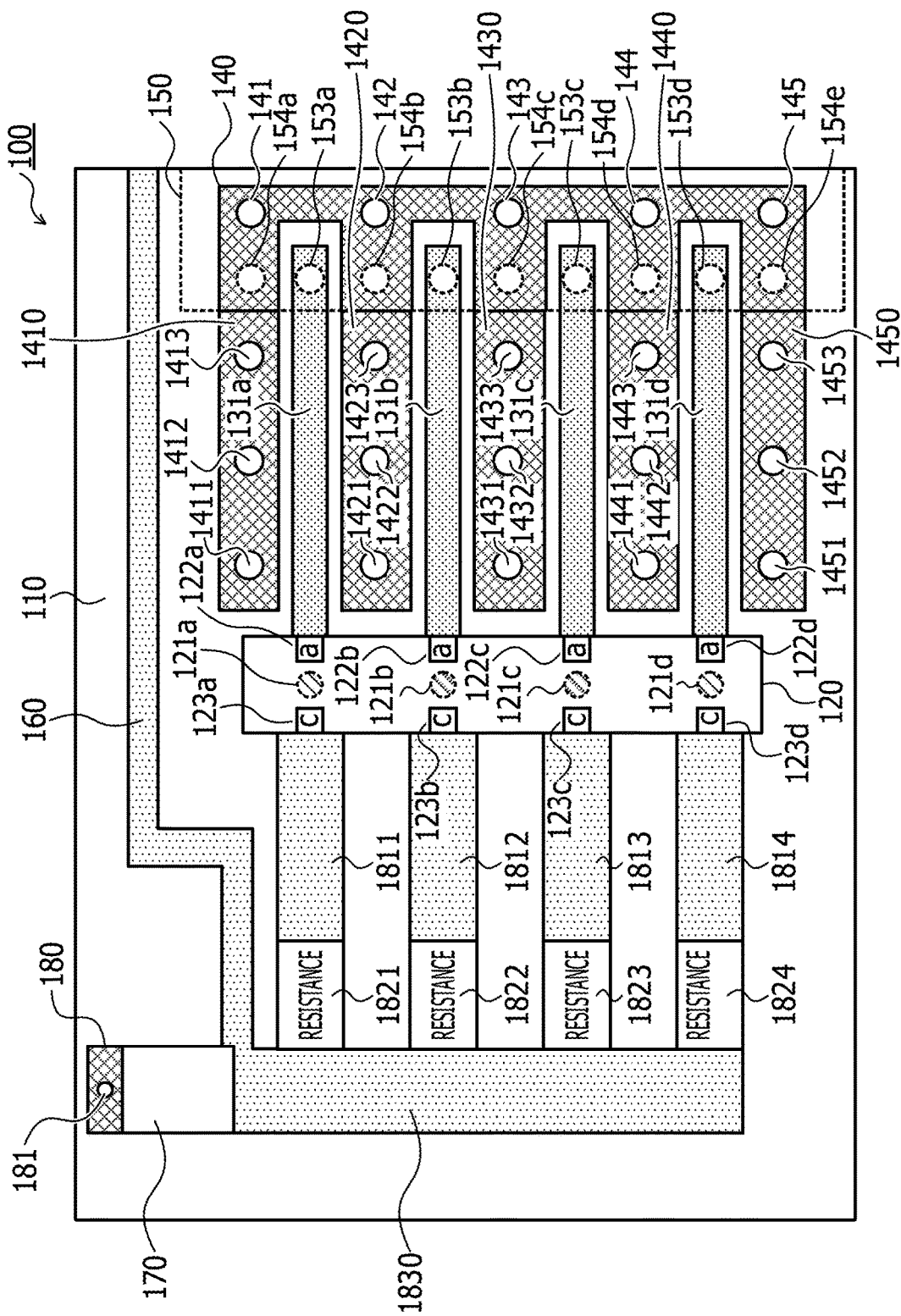
FIG. 24 is a bottom view illustrating an undersurface of another example of an optical receiver according to the second embodiment.

FIG. 23 is a top view illustrating another example of an optical receiver according to the second embodiment. FIG. 24 is a bottom view illustrating an undersurface of another example of an optical receiver according to the second embodiment. In FIG. 23 and FIG. 24, parts similar to the parts illustrated in FIG. 14, FIG. 15, and FIG. 18 are identified by the same reference numerals, and description thereof will be omitted. As illustrated in FIG. 23 and FIG. 24, the optical receiver 100 may include the ground lines 1410, 1420, 1430, 1440, and 1450 illustrated in FIG. 14 and FIG. 15 in addition to the configuration illustrated in FIG. 18, for example. In addition, in this case, the ground lines 1410, 1420, 1430, 1440, and 1450 may be coupled to the ground electrode 140.

When the ground lines 1410, 1420, 1430, 1440, and 1450 serving as shields are disposed on the sides of the anode lines 131a to 131d as illustrated in FIG. 23 and FIG. 24, crosstalk tolerance of the anode lines 131a to 131d as transmission lines may be improved.

In addition, in the configuration illustrated in FIG. 18 and the configuration illustrated in FIG. 23 and FIG. 24, a plurality of bypass capacitors may be arranged in parallel with each other for the bias of the PDs 121a to 121d, as illustrated in FIG. 16 and FIG. 17, for example.

Thus, in the optical receiver 100 according to the second embodiment, the cathode lines 1811 to 1814 and 1830 couple the cathodes 123a to 123d to the bias power supply (bias line 160) and the bypass capacitor 170 via the resistances 1821 to 1824. It is thereby possible to suppress the parallel resonance and the series resonance due to the fact that the optical receiver 100 is a multichannel receiver, and to suppress crosstalk between the channels.

In addition, the cathode line of the PD array 120 of the optical receiver 100 according to the second embodiment may include the cathode lines 1811 to 1814 coupled to the cathodes 123a to 123d, respectively, and the resistances 1821 to 1824 may be arranged on the cathode lines 1811 to 1814. Thus, in the configuration in which the cathodes 123a to 123d are coupled to the bias power supply and the bypass capacitor 170 via the resistances 1821 to 1824, respectively, voltage variation of Cathode Line Resistance Value×Current Value (IR) may be suppressed from becoming crosstalk.

In addition, the cathode line of the PD array 120 of the optical receiver 100 according to the second embodiment may include the cathode line 1830 coupled to the cathode lines 1811 to 1814 via the resistances 1821 to 1824, and coupled to the bias power supply and the bypass capacitor 170. It is thereby possible to suppress variation between the channels due to the wiring of a DC bias to the PDs 121a to 121d.

Third Embodiment

For a third embodiment, parts different from the first and second embodiments will be described. In the third embodiment, description will be made of a configuration in which the ground line 410 disposed on the undersurface of the printed board 110 includes holes arranged along the anode lines 131a to 131d.

(Optical Receiver According to Third Embodiment)

Figure 25:
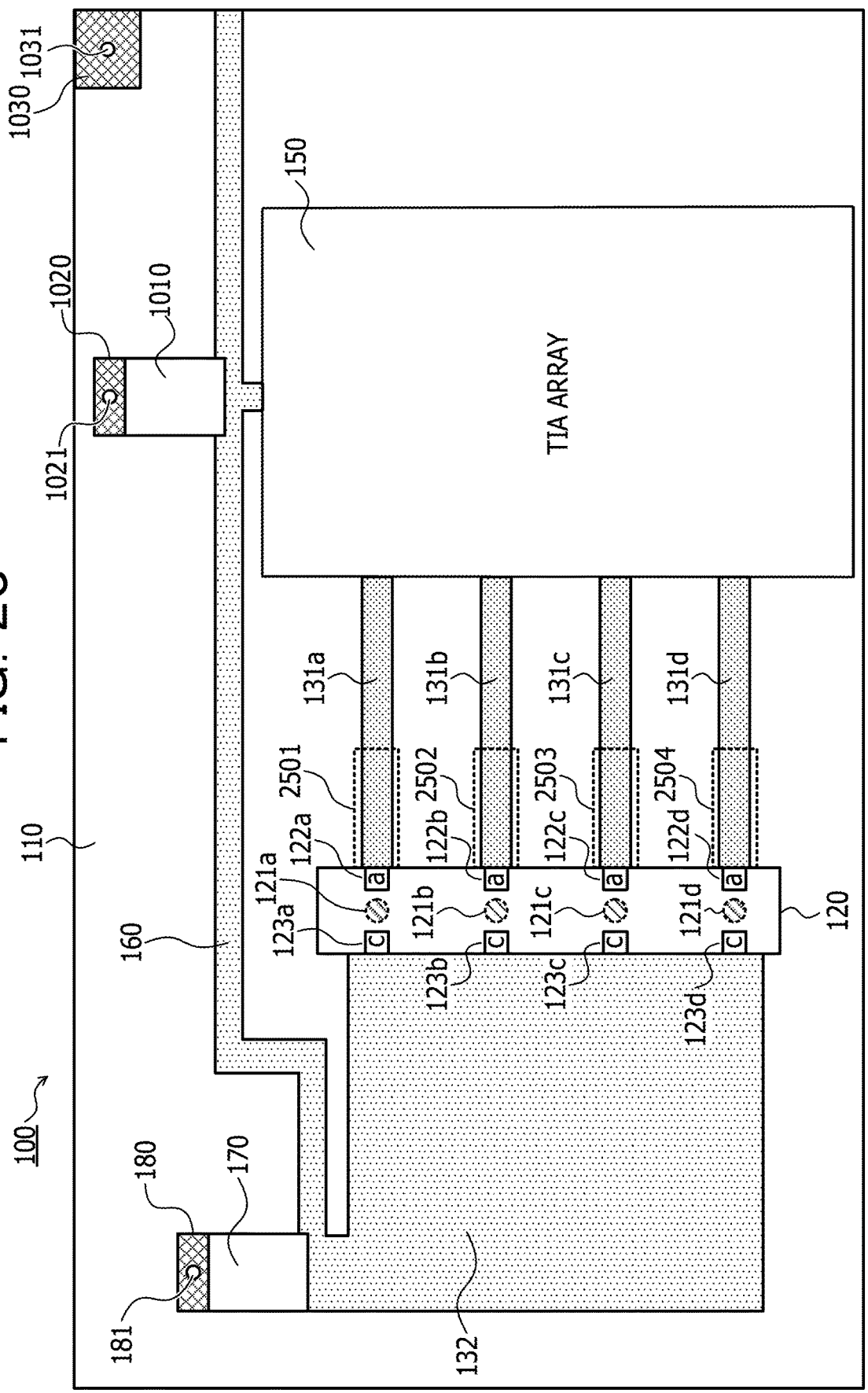
FIG. 25 is a top view illustrating one example of an optical receiver according to a third embodiment.
Figure 26:
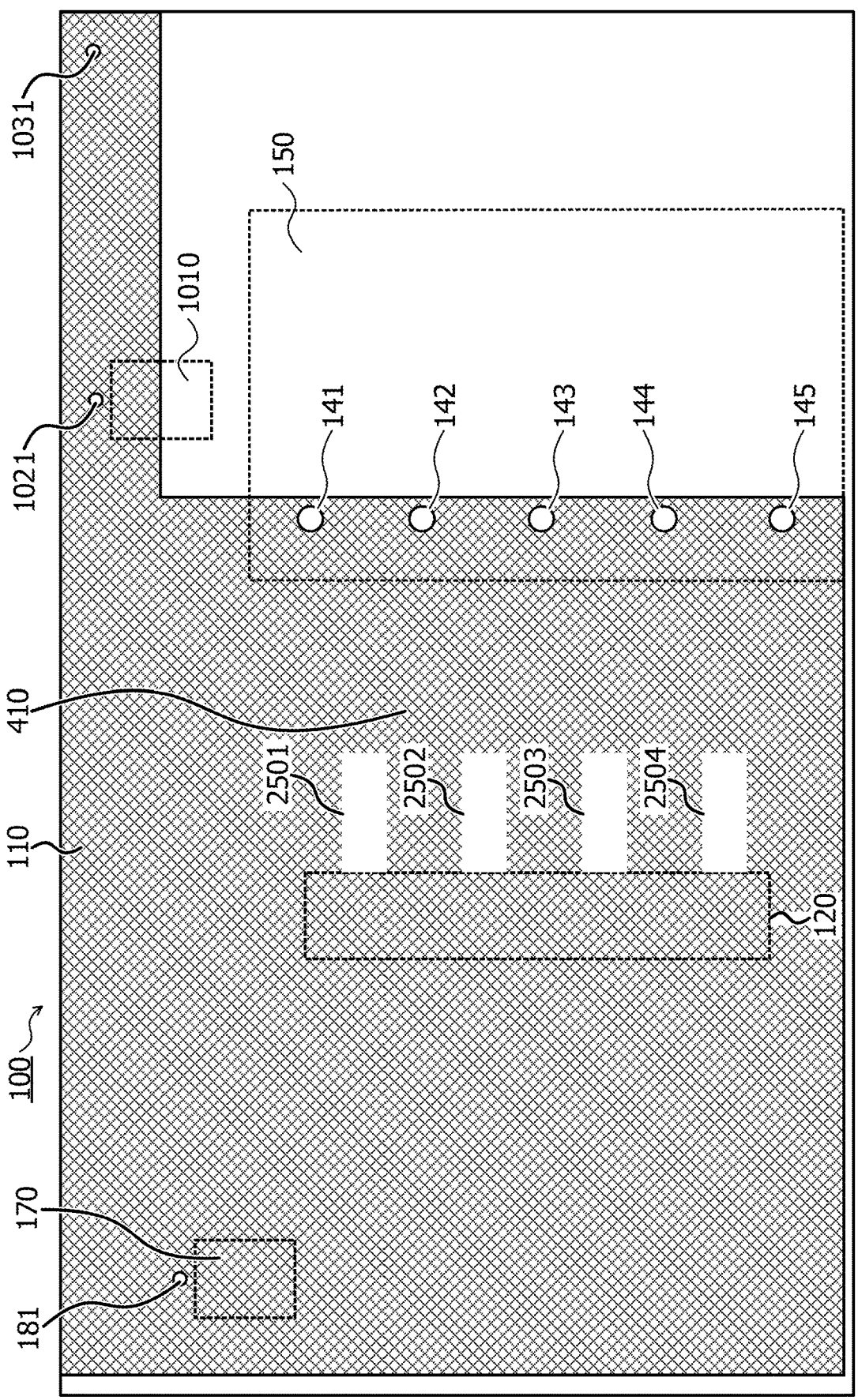
FIG. 26 is a bottom view illustrating an undersurface of one example of an optical receiver according to the third embodiment.

FIG. 25 is a top view illustrating one example of an optical receiver according to the third embodiment. FIG. 26 is a bottom view illustrating an undersurface of one example of an optical receiver according to the third embodiment. In FIG. 25 and FIG. 26, parts similar to the parts illustrated in FIG. 10, FIG. 11, and FIG. 18 are identified by the same reference numerals, and description thereof will be omitted.

As illustrated in FIG. 25 and FIG. 26, the optical receiver 100 according to the third embodiment includes holes 2501 to 2504 disposed in the ground line 410 on the undersurface of the printed board 110. The holes 2501 to 2504 are arranged along regions of the ground line 410, the regions corresponding to the anode lines 131a to 131d formed on the printed board 110.

When a structure is formed by removing parts of the ground line 410, the parts being below the anode lines 131a to 131d, as illustrated in FIG. 25 and FIG. 26, capacitances formed by the anode lines 131a to 131d and the ground line 410 may be reduced. It is thereby possible to suppress an increase in equivalent input noise of the TIA array 150 due to the capacitances. In addition, a current return path may be secured by arranging the holes 2501 to 2504 in only the parts of the ground line 410, the parts being below the anode lines 131a to 131d.

In addition, the hole 2501, for example, is disposed in a position corresponding to a part of the anode line 131a, the part being closer to the PD array 120. Similarly, the holes 2502 to 2504 are respectively disposed in positions corresponding to parts of the anode lines 131b to 131d, the parts being closer to the PD array 120. Consequently, the above-described increase in the equivalent input noise of the TIA array 150 may be suppressed more than in a case where the holes 2501 to 2504 are respectively arranged in positions corresponding to parts of the anode lines 131a to 131d, the parts being closer to the TIA array 150, for example.

When the length of each of the holes 2501 to 2504 is equal to or more than 1 [mm], for example, inductor components on the side of the anode lines 131a to 131d increase too much, and high-frequency characteristics of the channels are degraded. Therefore, degradation in the high-frequency characteristic of each channel may be suppressed by setting the length of the holes 2501 to 2504 to approximately 0.3 to 0.9 [mm].

Thus, in the optical receiver 100 according to the third embodiment, the ground line 410 disposed on the undersurface of the printed board 110 includes the holes 2501 to 2504. The holes 2501 to 2504 are arranged along the anode lines 131a to 131d arranged on the top surface (first surface) of the printed board 110. It is thereby possible to reduce the capacitances formed by the anode lines 131a to 131d and the ground line 410, and consequently suppress an increase in the equivalent input noise of the TIA array 150 due to the capacitances.

In addition, in the optical receiver 100 according to the third embodiment, the holes 2501 to 2504 may be arranged along parts of the anode lines 131a to 131d, the parts being on the side of the PD array 120. It is thereby possible to suppress an increase in equivalent input noise of the TIA array 150 more.

While with reference to FIG. 25, description has been made of a configuration in which the holes 2501 to 2504 are disposed on the ground line 410 of the optical receiver 100 according to the second embodiment, the holes 2501 to 2504 may be disposed on the ground line 410 of the optical receiver 100 according to the first embodiment.

In addition, in the optical receiver 100 according to the third embodiment, the ground lines 1410, 1420, 1430, 1440, and 1450 may be arranged on the sides of the anode lines 131a to 131d as illustrated in FIG. 14 and FIG. 15. In addition, in the optical receiver 100 according to the third embodiment, a plurality of bypass capacitors for the bias of the PDs 121a to 121d may be arranged in parallel with each other as illustrated in FIG. 16 and FIG. 17.

Fourth Embodiment

For a fourth embodiment, parts different from the first to third embodiments will be described. In the fourth embodiment, description will be made of a configuration in which the cathode lines 1811 to 1814 and the resistances 1821 to 1824 are disposed, and the cathode lines 1811 to 1814 are coupled to one another by inductors.

Due to DC components of currents flowing through the PDs 121a to 121d, for example, the resistances 1821 to 1824 cause a voltage drop (IR drop). In addition, there are manufacturing variations in the respective resistance values of the resistances 1821 to 1824. The variations vary respective voltages applied to the PDs 121a to 121d. Then, as long as a power supply voltage=3.3 [V] determined in the standard of QSFP, for example, is used, voltage values that may be applied to the PDs 121a to 121d are close to voltages needed to be applied to the PDs 121a to 121d, and ultimately reduce a design margin.

On the other hand, the optical receiver 100 according to the fourth embodiment is configured to conduct the DC components and not to conduct high-frequency components (state in which isolation is achieved) between the channels of the cathode lines 1811 to 1814.

(Optical Receiver According to Fourth Embodiment)

Figure 27:
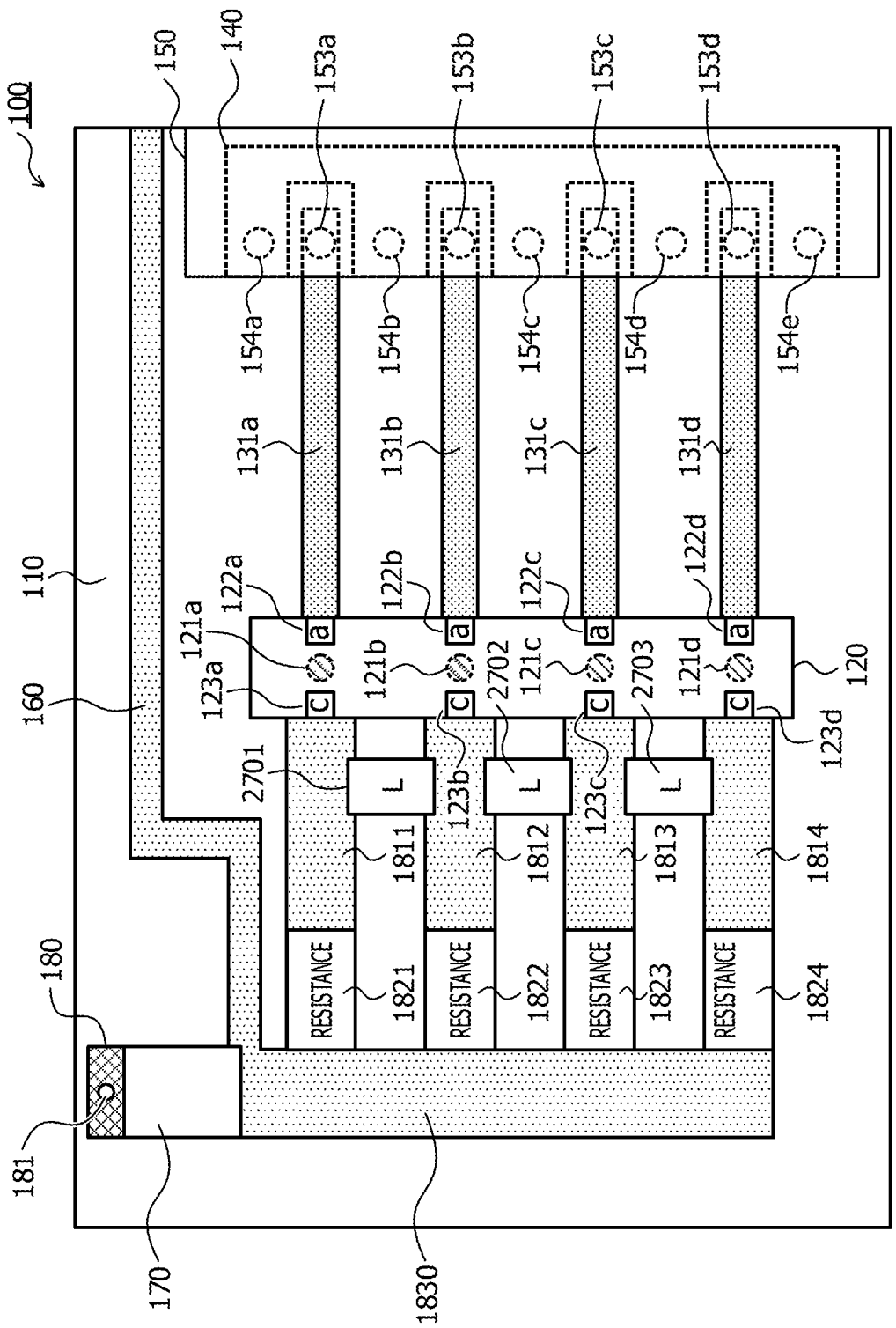
FIG. 27 is a top view illustrating one example of an optical receiver according to a fourth embodiment.

FIG. 27 is a top view illustrating one example of an optical receiver according to the fourth embodiment. In FIG. 27, parts similar to parts illustrated in FIG. 18 are identified by the same reference numerals, and description thereof will be omitted. As illustrated in FIG. 27, the optical receiver 100 according to the third embodiment includes inductor parts 2701 to 2703 in addition to the configuration illustrated in FIG. 18, for example.

The inductor parts 2701 to 2703 are parts having an inductance property such as coils or the like, the parts being arranged on the top surface of the printed board 110. The inductor part 2701 has one terminal coupled to the cathode line 1811, and has another terminal coupled to the cathode line 1812. The inductor part 2702 has one terminal coupled to the cathode line 1812, and has another terminal coupled to the cathode line 1813. The inductor part 2703 has one terminal coupled to the cathode line 1813, and has another terminal coupled to the cathode line 1814. The coupling between the inductor parts 2701 to 2703 and the cathode lines 1811 to 1813 may be made by, for example, solder or the like.

The inductor parts 2701 to 2703 may be made to conduct DC components and not to conduct high-frequency components (state in which isolation is achieved) between the channels of the cathode lines 1811 to 1814. Thus, even when the resistance values of the resistances 1821 to 1824 vary, voltage variations (IR drops) caused by the resistances 1821 to 1824 may be averaged, and therefore variations in the voltages applied to the PDs 121a to 121d may be suppressed.

(Another Example of Optical Receiver According to Fourth Embodiment)

Figure 28:
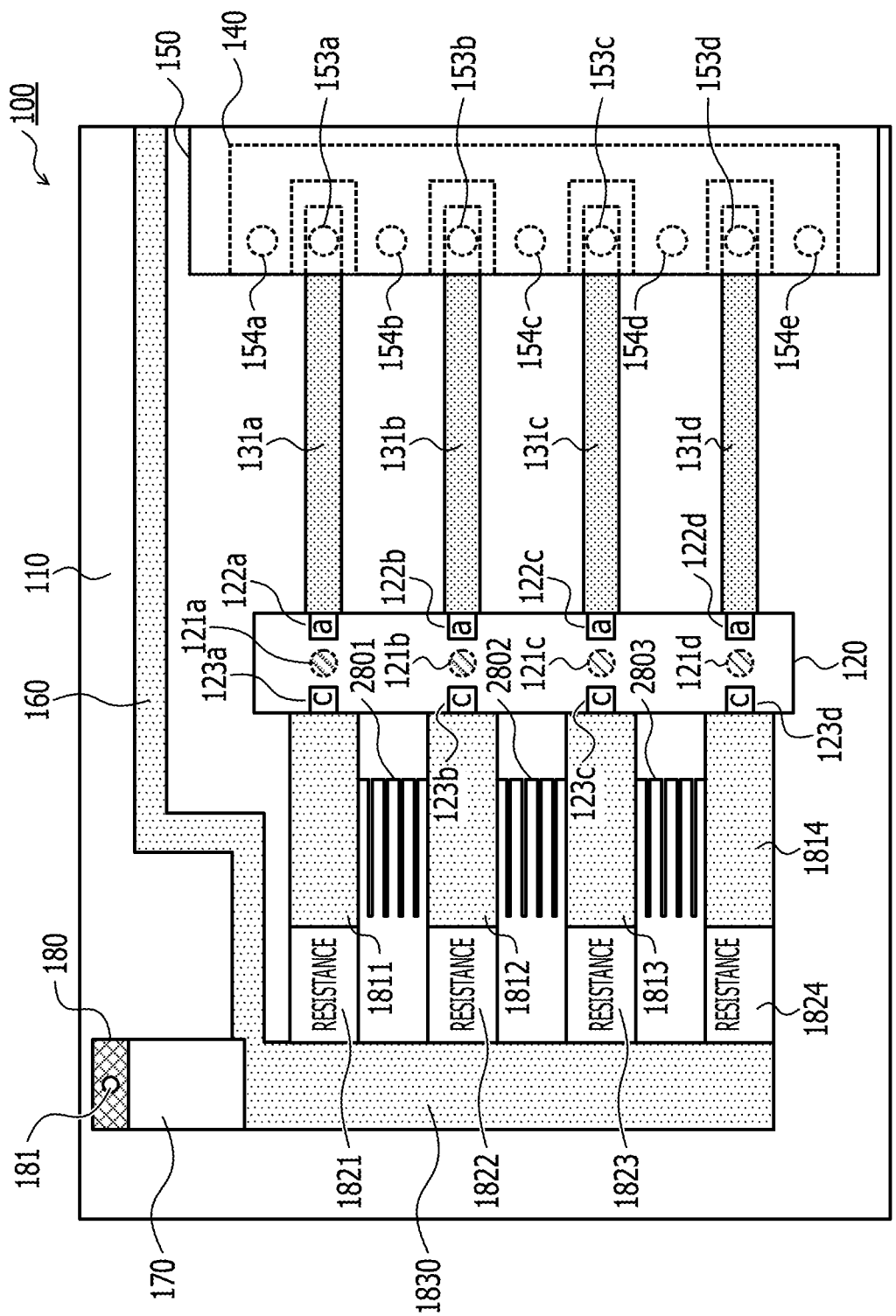
FIG. 28 is a top view illustrating another example of an optical receiver according to the fourth embodiment.

FIG. 28 is a top view illustrating another example of an optical receiver according to the fourth embodiment. In FIG. 28, parts similar to the parts illustrated in FIG. 27 are identified by the same reference numerals, and description thereof will be omitted. As illustrated in FIG. 28, the optical receiver 100 according to the third embodiment may include wiring patterns 2801 to 2803 securing an inductance property in place of the inductor parts 2701 to 2703 illustrated in FIG. 27.

The wiring patterns 2801 to 2803 are electric wiring formed in a shape having an inductance property on the top surface of the printed board 110. The wiring pattern 2801 has one terminal coupled to the cathode line 1811, and has another terminal coupled to the cathode line 1812. The wiring pattern 2802 has one terminal coupled to the cathode line 1812, and has another terminal coupled to the cathode line 1813. The wiring pattern 2803 has one terminal coupled to the cathode line 1813, and has another terminal coupled to the cathode line 1814.

As in the configuration illustrated in FIG. 27, even when the resistance values of the resistances 1821 to 1824 vary, the wiring patterns 2801 to 2803 may average voltage variations caused by the resistances 1821 to 1824, and thus suppress variations in the voltages applied to the PDs 121a to 121d.

A fine wiring forming method such as PF-EL or the like, for example, may be used to form the wiring patterns 2801 to 2803. A super-fine inkjet copper wiring technology, for example, may also be used to form the wiring patterns 2801 to 2803.

(Wiring Pattern of Optical Receiver According to Fourth Embodiment)

Figure 29:
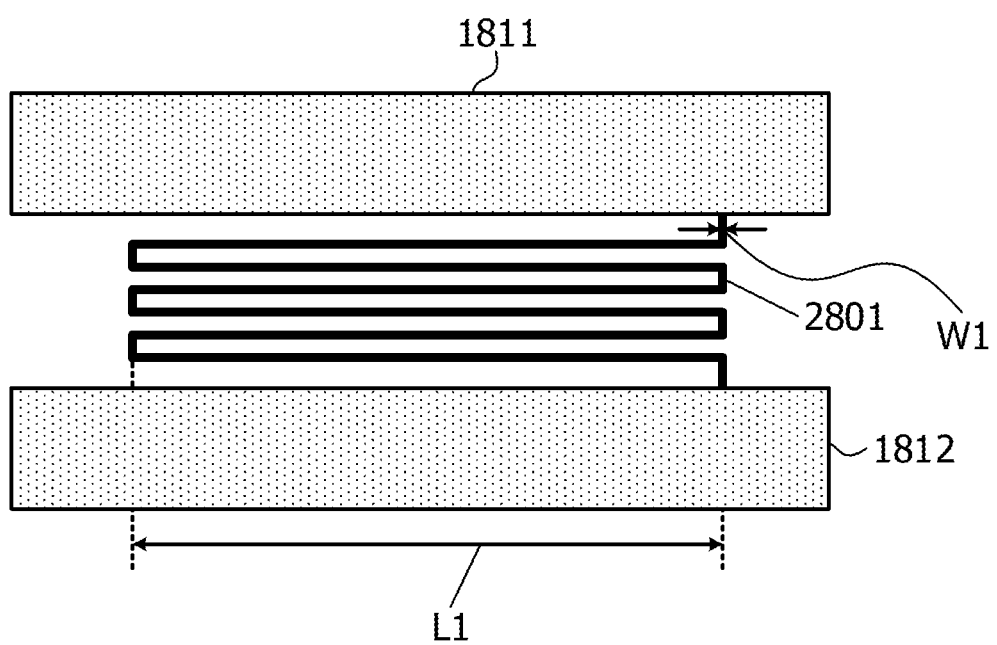
FIG. 29 is a diagram illustrating an example of a wiring pattern of an optical receiver according to the fourth embodiment.

FIG. 29 is a diagram illustrating an example of a wiring pattern of an optical receiver according to the fourth embodiment. In FIG. 29, parts similar to the parts illustrated in FIG. 28 are identified by the same reference numerals, and description thereof will be omitted. While the wiring pattern 2801 between the cathode line 1811 and the cathode line 1812 illustrated in FIG. 28 will be described with reference to FIG. 29, a similar description also applies to the wiring patterns 2802 to 2803 between the cathode lines 1812 to 1814.

For example, the wiring pattern 2801 may be a wiring pattern having a wiring width W1=3 [μm] and routed back and forth three times over a distance L1=580 [μm]. However, the wiring width W1, the distance L1, and the number of round trips of the wiring pattern 2801 may be this, and besides, may be changed arbitrarily.

(Frequency Characteristics of Electric Conductivity Between Channels of Cathode Lines in Optical Receiver According to Fourth Embodiment)

Figure 30:
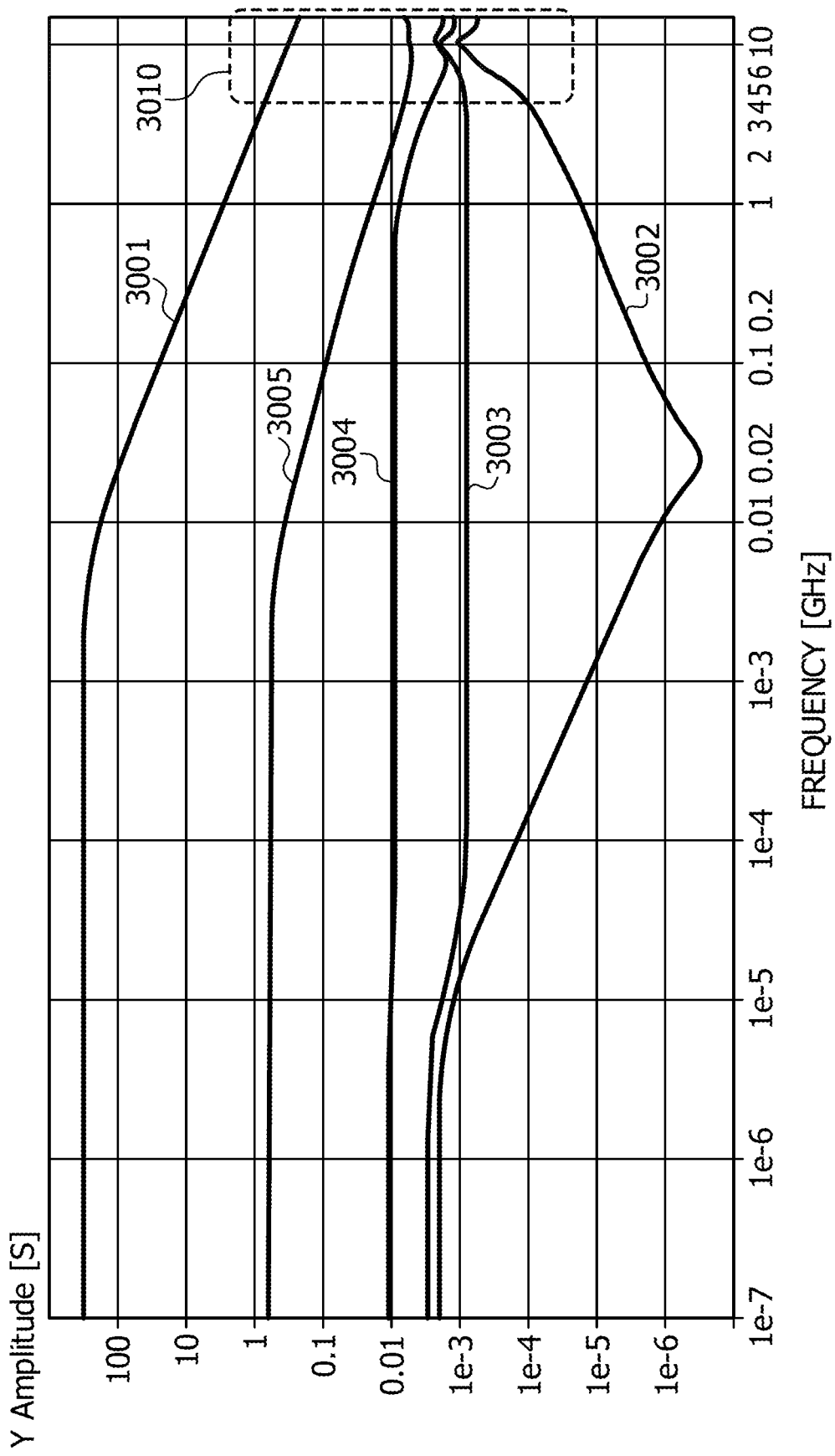
FIG. 30 is a diagram illustrating an example of frequency characteristics of electric conductivity between channels of cathode lines in an optical receiver according to the fourth embodiment.

FIG. 30 is a diagram illustrating an example of frequency characteristics of electric conductivity between channels of cathode lines in an optical receiver according to the fourth embodiment. In FIG. 30, an axis of abscissas indicates frequency [GHz], and an axis of ordinates indicates electric conductivity (Y Amplitude [S]) between the channels of the cathode lines. Electric conductivity is a reciprocal of a resistance value. Frequency characteristics 3001 to 3005 represent characteristics of electric conductivity between the channels of the cathode lines of the PDs 121a to 121d with respect to frequency. The frequency characteristic 3001, for example, represents a frequency characteristic in a case where the cathode line 132 common to the channels is disposed (see FIG. 1, for example).

The frequency characteristic 3002 represents a frequency characteristic in a case where there are disposed the cathode lines 1811 to 1814 independent between the channels and the resistances 1821 to 1824 each of 200 [Ω] (see FIG. 18, for example). The frequency characteristic 3003 represents a frequency characteristic in a case where there are disposed the cathode lines 1811 to 1814, the resistances 1821 to 1824 each of 200 [Ω], and the inductor parts 2701 to 2703 each of 1 [kΩ]+1 [nH] (see FIG. 27, for example).

The frequency characteristic 3004 represents a frequency characteristic in a case where there are disposed the cathode lines 1811 to 1814, the resistances 1821 to 1824 each of 200 [Ω], and the inductor parts 2701 to 2703 each of 100 [Ω]+10 [nH] (see FIG. 27, for example). The frequency characteristic 3005 represents a frequency characteristic in a case where there are disposed the cathode lines 1811 to 1814, the resistances 1821 to 1824 each of 200 [Ω], and the wiring patterns 2801 to 2803 (see FIG. 28, for example). Each of the wiring patterns 2801 to 2803 in this case is the same wiring pattern as the wiring pattern 2801 illustrated in FIG. 28, for example.

Figure 31:
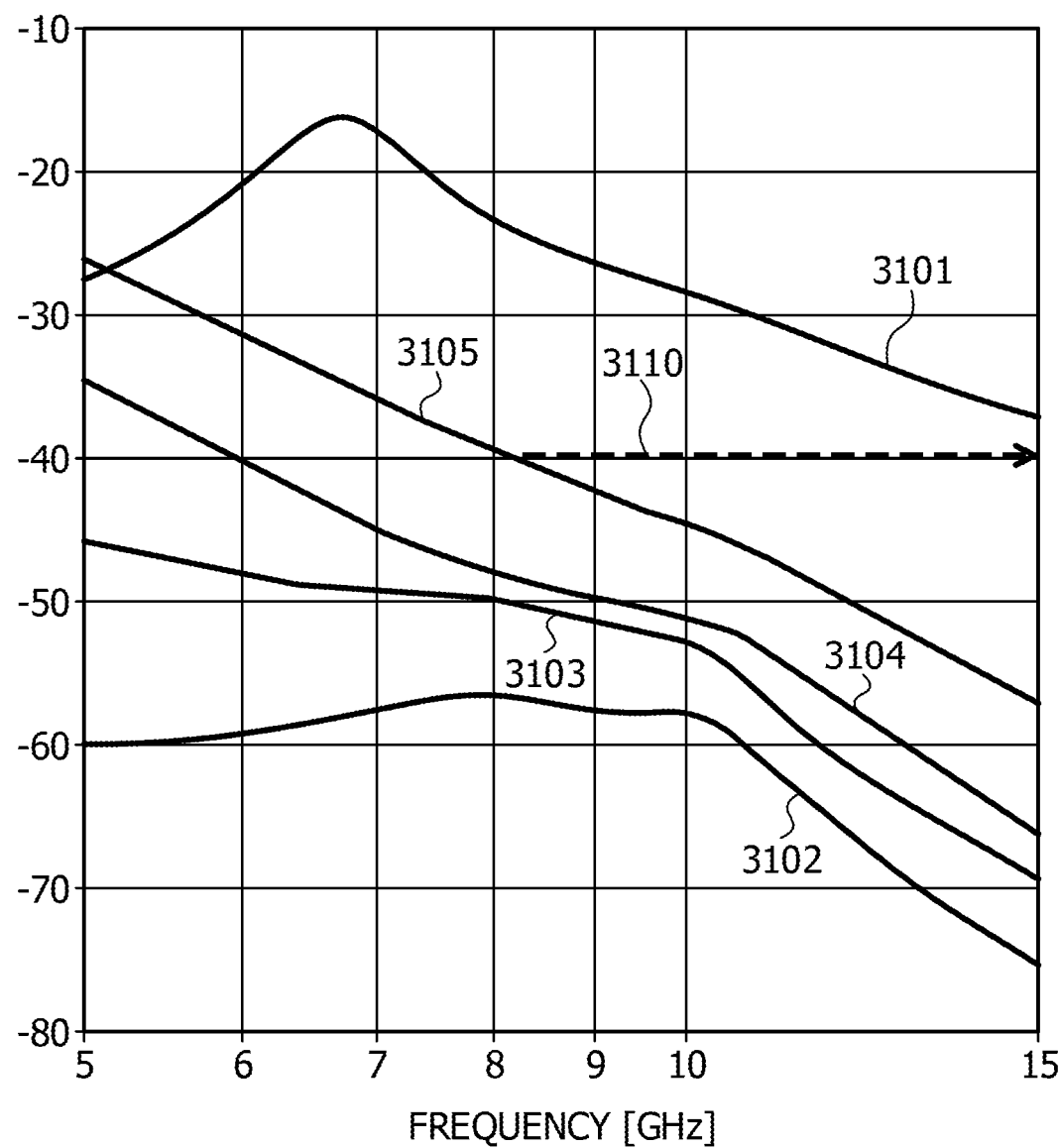
FIG. 31 is a diagram illustrating an example of frequency characteristics of isolation between channels of cathode lines by an optical receiver according to the fourth embodiment.

FIG. 31 is a diagram illustrating an example of frequency characteristics of isolation between channels of cathode lines by an optical receiver according to the fourth embodiment. In FIG. 31, an axis of abscissas indicates frequency [GHz], and an axis of ordinates indicates isolation (S Amplitude [dB]) between the channels of the cathode lines. Frequency characteristics 3101 to 3105 represent frequency characteristics of isolation between the channels of the cathode lines of the PDs 121a to 121d in a frequency region 3010 illustrated in FIG. 30. In addition, the frequency characteristics 3101 to 3105 are isolation frequency characteristics respectively corresponding to the frequency characteristics 3001 to 3005 illustrated in FIG. 30.

As indicated by the frequency characteristics 3101 to 3105, DC resistances may be reduced by disposing the inductor parts 2701 to 2703 or the wiring patterns 2801 to 2803 between the cathode lines 1811 to 1814. In addition, there is isolation of −40 [dB] or less in a region 3110 of a Nyquist frequency of a transmission rate (for example, 12 [Gbps] or 15 [Gbps]) sensitive to crosstalk between the channels.

Thus, the optical receiver 100 according to the fourth embodiment includes inductors (for example, the inductor parts 2701 to 2703 or the wiring patterns 2801 to 2803) coupling the cathode lines 1811 to 1814 to one another. It is thereby possible to conduct DC components and not to conduct high-frequency components (state in which isolation is achieved) between the channels of the cathode lines 1811 to 1814.

Thus, even when the resistance values of the resistances 1821 to 1824 vary, voltage variations (IR drops) caused by the resistances 1821 to 1824 may be averaged, and variations in the voltages applied to the PDs 121a to 121d (bias variations) may be suppressed. Hence, it is possible to have room for a design margin with regard to the voltages applied to the PDs 121a to 121d, for example.

As described above, the optical receiver may suppress crosstalk.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An optical receiver comprising:
   a light receiving element array that includes a plurality of light receiving elements;
   a plurality of amplifiers that amplify respective currents obtained by the plurality of light receiving elements;
   a plurality of anode lines arranged in a region between the light receiving element array and the plurality of amplifiers, the plurality of anode lines coupling respective anodes of the plurality of light receiving elements to the plurality of amplifiers, respectively;
   a cathode line disposed in a region different from the region between the light receiving element array and the plurality of amplifiers, the cathode line coupling respective cathodes of the plurality of light receiving elements to a bias power supply and a bypass capacitor; and
   a ground line disposed between the plurality of anode lines so as to be in parallel with the plurality of anode lines.

2. The optical receiver according to claim 1, wherein the light receiving element array, the plurality of amplifiers, the plurality of anode lines, and the cathode line being arranged on a top surface of a board, and the optical receiver further comprising:
   a ground line disposed on an undersurface of a part of the board, the part having the cathode line disposed on the top surface of the part, the ground line being coupled to the plurality of amplifiers.

3. The optical receiver according to claim 1, wherein the bypass capacitor is a plurality of bypass capacitors arranged in parallel with each other.

4. The optical receiver according to claim 1, wherein the respective anodes of the plurality of light receiving elements and the respective cathodes of the plurality of light receiving elements are arranged on opposite sides from each other in the light receiving element array.

5. The optical receiver according to claim 1, wherein the cathode line couples the respective cathodes of the plurality of light receiving elements to the bias power supply and the bypass capacitor via a resistance.

6. The optical receiver according to claim 5, wherein the cathode line includes a plurality of cathode lines coupled to the respective cathodes of the plurality of light receiving elements, respectively, and the resistance is arranged for each of the plurality of cathode lines.

7. The optical receiver according to claim 6, wherein the cathode line includes a cathode line coupled to the plurality of cathode lines via the resistance, and coupled to the bias power supply and the bypass capacitor.

8. The optical receiver according to claim 2, wherein the ground line disposed on the undersurface includes holes respectively arranged along the plurality of anode lines arranged on the top surface.

9. The optical receiver according to claim 8, wherein the holes are arranged along parts of the plurality of anode lines, the parts being on a side of the light receiving element array.

10. The optical receiver according to claim 6, further comprising: an inductor that couples the plurality of cathode lines to each other.

\* \* \* \* \*